(12) United States Patent
Shih et al.

(10) Patent No.: US 12,740,001 B2
(45) Date of Patent: Sep. 15, 2026

(54) RAIL MOUNTING BACKPLANE KIT AND RELATED RAIL MOUNTING ELECTRONIC DEVICE

(71) Applicant: Moxa Inc., New Taipei City (TW)

(72) Inventors: Chun-Jen Shih, New Taipei City (TW); Chih-Hsiang Tang, New Taipei City (TW)

(73) Assignee: Moxa Inc., New Taipei City (TW)

( * ) Notice: Subject to any disclaimer, the term of this patent is extended or adjusted under 35 U.S.C. 154(b) by 255 days.

(21) Appl. No.: 18/631,067

(22) Filed: Apr. 10, 2024

(65) Prior Publication Data

US 2024/0407123 A1 Dec. 5, 2024

Related U.S. Application Data

(60) Provisional application No. 63/469,551, filed on May 30, 2023.

(30) Foreign Application Priority Data

Dec. 22, 2023 (TW) ................................ 112150308

(51) Int. Cl.
*H05K 7/14* (2006.01)

(52) U.S. Cl.
CPC ......... *H05K 7/1474* (2013.01); *H05K 7/1465* (2013.01)

(58) Field of Classification Search
None
See application file for complete search history.

(56) References Cited

U.S. PATENT DOCUMENTS 3,339,954 A 9/1967 Alvden
4,501,460 A 2/1985 Sisler
(Continued)

FOREIGN PATENT DOCUMENTS

CN 105789931 A 7/2016
CN 108141977 A 6/2018
(Continued)

OTHER PUBLICATIONS

Shih, the specification, including the claims, and drawings in the U.S. Appl. No. 18/533,014, Filing Date: Dec. 7, 2023.
(Continued)

*Primary Examiner* — James Wu
*Assistant Examiner* — Christopher L Augustin
(74) *Attorney, Agent, or Firm* — Winston Hsu

(57) ABSTRACT

A rail mounting backplane kit is provided and including a backplane assembly, a first mating structure and a second cooperating structure. The first mating structure is for cooperating with a first cooperating structure of a first cooperating backplane kit for allowing or restraining assembly of the backplane assembly and a first cooperating backplane assembly of the first cooperating backplane kit, and the first mating structure includes a plurality of first mating features, which can selectively be protruding, flat or recessed mating features. The second cooperating structure is for cooperating with a second mating structure of a second cooperating backplane kit for allowing or restraining assembly of the backplane assembly and a second cooperating backplane assembly of the second cooperating backplane kit, and the second cooperating structure includes a plurality of second cooperating features, which can selectively be protruding, flat, or recessed cooperating features.

17 Claims, 15 Drawing Sheets

(56) References Cited

U.S. PATENT DOCUMENTS 4,558,914 A 12/1985 Prager
4,648,737 A 3/1987 Lake, Jr.
4,738,632 A 4/1988 Schmidt
5,253,140 A 10/1993 Inoue
5,493,194 A 2/1996 Damiano
5,508,886 A 4/1996 Bernecker
5,677,830 A 10/1997 Nogas
5,737,189 A 4/1998 Kammersgard
6,008,985 A 12/1999 Lake
6,172,875 B1 1/2001 Suzuki
6,456,495 B1 * 9/2002 Wieloch ............... H05K 7/1477 361/801
6,520,605 B2 2/2003 Nunokawa
6,840,819 B2 1/2005 Bet
7,021,974 B2 * 4/2006 Sichner .................... H05K 5/30 439/732
7,073,971 B2 7/2006 Schurr
7,210,586 B2 5/2007 Ice
7,299,667 B1 11/2007 Miresmaili
7,374,453 B1 5/2008 Allcock
8,597,037 B2 12/2013 Halim
8,628,004 B2 1/2014 Vazach
9,153,910 B2 10/2015 Aoki
9,276,349 B2 3/2016 Yoshida
9,325,110 B2 4/2016 Lostoski
9,386,718 B2 7/2016 Kusumi
9,408,321 B2 8/2016 Nomoto
9,444,231 B2 9/2016 Ho
9,483,928 B2 * 11/2016 Molnar ............. H01R 13/6683
9,564,707 B2 2/2017 Geitner
9,865,945 B2 1/2018 Isobe
9,894,797 B2 2/2018 Sampath
9,936,598 B2 4/2018 Gruber
9,966,714 B1 5/2018 Sreedharan
10,314,194 B1 6/2019 Chiang
10,483,663 B2 11/2019 Wrobel
10,716,235 B1 7/2020 Farnsworth
11,243,504 B2 2/2022 Wrobel
11,347,195 B2 5/2022 Kretschmann
11,408,560 B2 8/2022 Miyake
11,576,275 B2 2/2023 Huang
11,659,676 B2 5/2023 Chung
12,245,391 B2 3/2025 Ke
2001/0046144 A1 11/2001 Murabayashi
2003/0143896 A1 7/2003 Bet
2006/0221581 A1 10/2006 DeNies
2009/0244815 A1 * 10/2009 Carolis ................ H01R 9/2483 174/72 B
2010/0200523 A1 8/2010 Henderson
2015/0015129 A1 1/2015 Ding
2015/0214657 A1 7/2015 Geitner
2015/0250312 A1 9/2015 Barrett
2015/0349452 A1 * 12/2015 Yoshida ............... H01R 13/639 439/347
2018/0020564 A1 1/2018 Kang
2020/0107464 A1 * 4/2020 Lostoski .............. H05K 7/1474
2022/0256731 A1 8/2022 Gurlt
2024/0407120 A1 12/2024 Shih

FOREIGN PATENT DOCUMENTS

CN 109729678 A 5/2019
CN 107305992 B 6/2020
CN 211128561 U 7/2020
DE 6 78 23 090.7 U1 7/1981
EP 0 661 915 A1 7/1995
EP 0 599 551 B1 8/1996
EP 0 896 504 A2 2/1999
EP 0 944 121 A1 9/1999
EP 1 595 313 B1 6/2007
JP 62-98287 A 5/1987
JP 62-98287 U 6/1987
JP 4-19976 A 1/1992
JP 6-216549 A 8/1994
JP 11-103182 A 4/1999
JP 11-168284 A 6/1999
JP 11-274758 A 10/1999
JP 11-284360 A 10/1999
JP 11-354944 A 12/1999
JP 2000-59043 A 2/2000
JP 2001-217016 A 8/2001
JP 2002-231353 A 8/2002
JP 2002-231385 A 8/2002
JP 2003-298251 A 10/2003
JP 2003-298256 A 10/2003
JP 2006-114908 A 4/2006
JP 2010-113444 A 5/2010
JP 2013-74020 A 4/2013
JP 2016-35845 A 3/2016
JP 2016-54266 A 4/2016
JP 6087479 B1 3/2017
JP 2021-81766 A 5/2021
TW 202119145 A 5/2021
WO WO-9735458 A1 * 9/1997 ............... H05K 7/14
WO 2009/140987 A1 11/2009
WO 2014/016190 A2 1/2014

OTHER PUBLICATIONS

Tang, the specification, including the claims, and drawings in the U.S. Appl. No. 18/528,803, Filing Date: Dec. 5, 2023.

* cited by examiner

RAIL MOUNTING BACKPLANE KIT AND RELATED RAIL MOUNTING ELECTRONIC DEVICE

CROSS REFERENCE TO RELATED APPLICATIONS

This application claims the benefit of U.S. Provisional Application No. 63/469,551, filed on May 30, 2023. The content of the application is incorporated herein by reference.

BACKGROUND OF THE INVENTION

1. Field of the Invention

The present invention relates to a rail mounting backplane kit and a related rail mounting electronic device, and more specifically, to a rail mounting backplane kit with fool-proof design and a related rail mounting electronic device.

2. Description of the Prior Art

Modularity has gradually become a mainstream trend of rail mounting electronic devices. For example, a remote terminal unit is a rail mounting electronic device installed at a field location as part of a monitor/control system for monitoring/controlling field devices. The remote terminal unit usually includes multiple modules, which may include a power supply module, a signal switch module, a computing module, and a signal input/output module, and a common backplane for mounting the multiple modules. However, an improvement of the rail mounting electronic device for easy operation is urgently needed.

SUMMARY OF THE INVENTION

It is an objective of the present invention to provide a rail mounting backplane kit with fool-proof design and a related rail mounting electronic device for solving the aforementioned problem.

In order to achieve the aforementioned objective, the present invention discloses a rail mounting backplane kit. The rail mounting backplane kit includes a backplane assembly, a first mating structure and a second cooperating structure. The first mating structure is formed on the backplane assembly. The first mating structure includes a plurality of first mating features. Each of the plurality of first mating features is a first protruding mating feature, a first flat mating feature or a first recessed mating feature. The first mating structure is configured to cooperate with a first cooperating structure of a first cooperating backplane kit for allowing or preventing an assembly of the backplane assembly and a first cooperating backplane assembly of the first cooperating backplane kit. The second cooperating structure is formed on the backplane assembly. The second cooperating structure includes a plurality of second cooperating features. Each of the plurality of second cooperating features is a second protruding cooperating feature, a second flat cooperating feature or a second recessed cooperating feature. The second cooperating structure is configured to cooperate with a second mating structure of a second cooperating backplane kit for allowing or preventing an assembly of the backplane assembly and a second cooperating backplane assembly of the second cooperating backplane kit.

According to an embodiment of the present invention, the plurality of first mating features are arranged in a matrix, and the plurality of second cooperating features are arranged in a matrix.

According to an embodiment of the present invention, when one of the plurality of first mating features and a corresponding one of a plurality of first cooperating features of the first cooperating structure are the first protruding mating feature and a first recessed cooperating feature, respectively, the first protruding mating feature is configured to stretch into the first recessed cooperating feature for allowing the assembly of the backplane assembly of the rail mounting backplane kit and the first cooperating backplane assembly of the first cooperating backplane kit.

According to an embodiment of the present invention, when one of the plurality of first mating features and a corresponding one of a plurality of first cooperating features of the first cooperating structure are the first protruding mating feature and one of a first protruding cooperating feature and a first flat cooperating feature, respectively, the first protruding mating feature is configured to abut against the first protruding cooperating feature or the first flat cooperating feature for preventing the assembly of the backplane assembly of the rail mounting backplane kit and the first cooperating backplane assembly of the first cooperating backplane kit.

According to an embodiment of the present invention, when one of the plurality of second cooperating features and a corresponding one of a plurality of second mating features of the second mating structure are the second protruding cooperating feature and a second recessed mating feature, respectively, the second protruding cooperating feature is configured to stretch into the second recessed mating feature for allowing the assembly of the backplane assembly of the rail mounting backplane kit and the second cooperating backplane assembly of the second cooperating backplane kit.

According to an embodiment of the present invention, when one of the plurality of second cooperating features and a corresponding one of a plurality of second mating features of the second mating structure are the second protruding cooperating feature and one of a second protruding mating feature and a second flat mating feature, respectively, the second protruding cooperating feature is configured to abut against the second protruding mating feature or the second flat mating feature for preventing the assembly of the backplane assembly of the rail mounting backplane kit and the second cooperating backplane assembly of the second cooperating backplane kit.

In order to achieve the aforementioned objective, the present invention further discloses a rail mounting electronic device. The rail mounting electronic device includes a first module, a second module and a first mating module. The second module is detachably assembled with the first module. The first mating module is disposed between the first module and the second module. The first mating module includes a first mating structure and a first cooperating structure. The first mating structure is formed on the second module. The first mating structure includes a plurality of first mating features. Each of the plurality of first mating features is a first protruding mating feature, a first flat mating feature or a first recessed mating feature. The first cooperating structure is formed on the first module. The first cooperating structure includes a plurality of first cooperating features. Each of the plurality of first cooperating features is a first protruding cooperating feature, a first flat cooperating feature or a first recessed cooperating feature. When one of the plurality of first mating features is the first protruding mating feature, a corresponding one of the plurality of first cooperating features is the first recessed cooperating feature. When one of the plurality of first mating features is the first flat mating feature, a corresponding one of the plurality of first cooperating features is the first flat cooperating feature or the first recessed cooperating feature. When one of the plurality of first mating features is the first recessed mating feature, a corresponding one of the plurality of first cooperating features is the first protruding cooperating feature, the first flat cooperating feature or the first recessed cooperating feature.

According to an embodiment of the present invention, the plurality of first mating features are arranged in a matrix, and the plurality of first cooperating features are arranged in a matrix.

According to an embodiment of the present invention, the rail mounting electronic device further includes a third module and a second mating module. The third module detachably is assembled with the second module. The second mating module is disposed between the second module and the third module. The second mating module includes a second mating structure and a second cooperating structure. The second mating structure is formed on the third module. The second mating structure includes a plurality of second mating features. Each of the plurality of second mating features is a second protruding mating feature, a second flat mating feature or a second recessed mating feature. The second cooperating structure is formed on the second module. The second cooperating structure includes a plurality of second cooperating features. Each of the plurality of second cooperating features is a second protruding cooperating feature, a second flat cooperating feature or a second recessed cooperating feature. When one of the plurality of second mating features is the second protruding mating feature, a corresponding one of the plurality of second cooperating features is the second recessed cooperating feature. When one of the plurality of second mating features is the second flat mating feature, a corresponding one of the plurality of second cooperating features is the second flat cooperating feature or the second recessed cooperating feature. When one of the plurality of second mating features is the second recessed mating feature, a corresponding one of the plurality of second cooperating features is the second protruding cooperating feature, the second flat cooperating feature or the second recessed cooperating feature.

According to an embodiment of the present invention, when one of the plurality of second mating features is the second protruding mating feature, a corresponding one of the plurality of first cooperating features is the first flat cooperating feature or the first protruding cooperating feature.

According to an embodiment of the present invention, the first module, the second module and the third module are a power supply module, a computing module and a signal input/output module, respectively.

According to an embodiment of the present invention, the plurality of first mating features are arranged in a matrix. The plurality of second mating features are arranged in a matrix. The plurality of first cooperating features are arranged in a matrix, and the plurality of second cooperating features are arranged in a matrix.

According to an embodiment of the present invention, the rail mounting electronic device further includes a fourth module and a third mating module. The fourth module is detachably assembled with the third module. The third mating module is disposed between the third module and the fourth module. The third mating module includes a third mating structure and a third cooperating structure. The third mating structure is formed on the fourth module. The third mating structure includes a plurality of third mating features. Each of the plurality of third mating features is a third protruding mating feature, a third flat mating feature or a third recessed mating feature. The third cooperating structure is formed on the third module. The third cooperating structure includes a plurality of third cooperating features. Each of the plurality of third cooperating features is a third protruding cooperating feature, a third flat cooperating feature or a third recessed cooperating feature. When one of the plurality of third mating features is the third protruding mating feature, a corresponding one of the plurality of third cooperating features is the third recessed cooperating feature. When one of the plurality of third mating features is the third flat mating feature, a corresponding one of the plurality of third cooperating features is the third flat cooperating feature. When one of the plurality of third mating features is the third recessed mating feature, a corresponding one of the plurality of third cooperating features is the third protruding cooperating feature.

According to an embodiment of the present invention, when one of the plurality of second mating features is the second protruding mating feature, a corresponding one of the plurality of first cooperating features is the first flat cooperating feature or the first protruding cooperating feature.

According to an embodiment of the present invention, when one of the plurality of third mating features is the third protruding mating feature, a corresponding one of the plurality of first cooperating features is the first flat cooperating feature or the first protruding cooperating feature, and a corresponding one of the plurality of second cooperating features is the second recessed cooperating feature.

According to an embodiment of the present invention, the first module, the second module, the third module and the fourth module are a power supply module, a computing module, a signal input/output module and an additional signal input/output module, respectively.

According to an embodiment of the present invention, when one of the plurality of second mating features is the second protruding mating feature, a corresponding one of the plurality of first cooperating features is the first recessed cooperating feature.

According to an embodiment of the present invention, when one of the plurality of third mating features is the third protruding mating feature, a corresponding one of the plurality of first cooperating feature is the first flat cooperating feature or the first protruding cooperating feature, and a corresponding one of the plurality of second cooperating feature is the second flat cooperating feature or the second protruding cooperating feature.

According to an embodiment of the present invention, the first module, the second module, the third module and the fourth module are a power supply module, a signal switch module, a computing module and a signal input/output module, respectively.

According to an embodiment of the present invention, the plurality of first mating features are arranged in a matrix. The plurality of second mating features are arranged in a matrix. The plurality of third mating features are arranged in a matrix. The plurality of first cooperating features are arranged in a matrix. The plurality of second cooperating features are arranged in a matrix, and the plurality of third cooperating features are arranged in a matrix.

In summary, the present invention can ensure the first cooperating backplane assembly, the backplane assembly and the second cooperating backplane assembly to be assembled together in a proper sequence, or ensure the first backplane assembly, the second backplane assembly, the third backplane assembly and the fourth backplane assembly to be assembled together in a proper sequence. Therefore, the present invention can effectively prevent damage or functional failure caused by an error of assembly.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" is intended to mean either an indirect or direct electrical/mechanical connection. Thus, if a first device is connected to a second device, that connection may be through a direct electrical/mechanical connection, or through an indirect electrical/mechanical connection via other devices and connections.

Besides, when an ordinal number (such as "first", "second", "third" and so on) is used as an adjective before a term, that ordinal number is used (unless expressly specified otherwise) merely to indicate a particular feature, such as to distinguish that particular feature from another feature that is described by the same term or by a similar term, but that ordinal number does not have any other meaning or limiting effect—it is merely a convenient name. For example, a "first device" may be so named merely to distinguish it from, e.g., a "second device". Thus, the mere usage of the ordinal numbers "first" and "second" before the term "device" does not indicate any other relationship between the two devices, and likewise does not indicate any other characteristics of either or both devices. For example, the mere usage of the ordinal numbers "first" and "second" before the term "device" (1) does not indicate that either device comes before or after any other in order or location; (2) does not indicate that either device occurs or acts before or after any other in time; and (3) does not indicate that either device ranks above or below any other, as in importance or quality. The mere usage of ordinal numbers does not define a numerical limit to the features identified with the ordinal numbers. For example, the mere usage of the ordinal numbers "first" and "second" before the term "device" does not indicate that there are exactly two devices.

Figure 1:
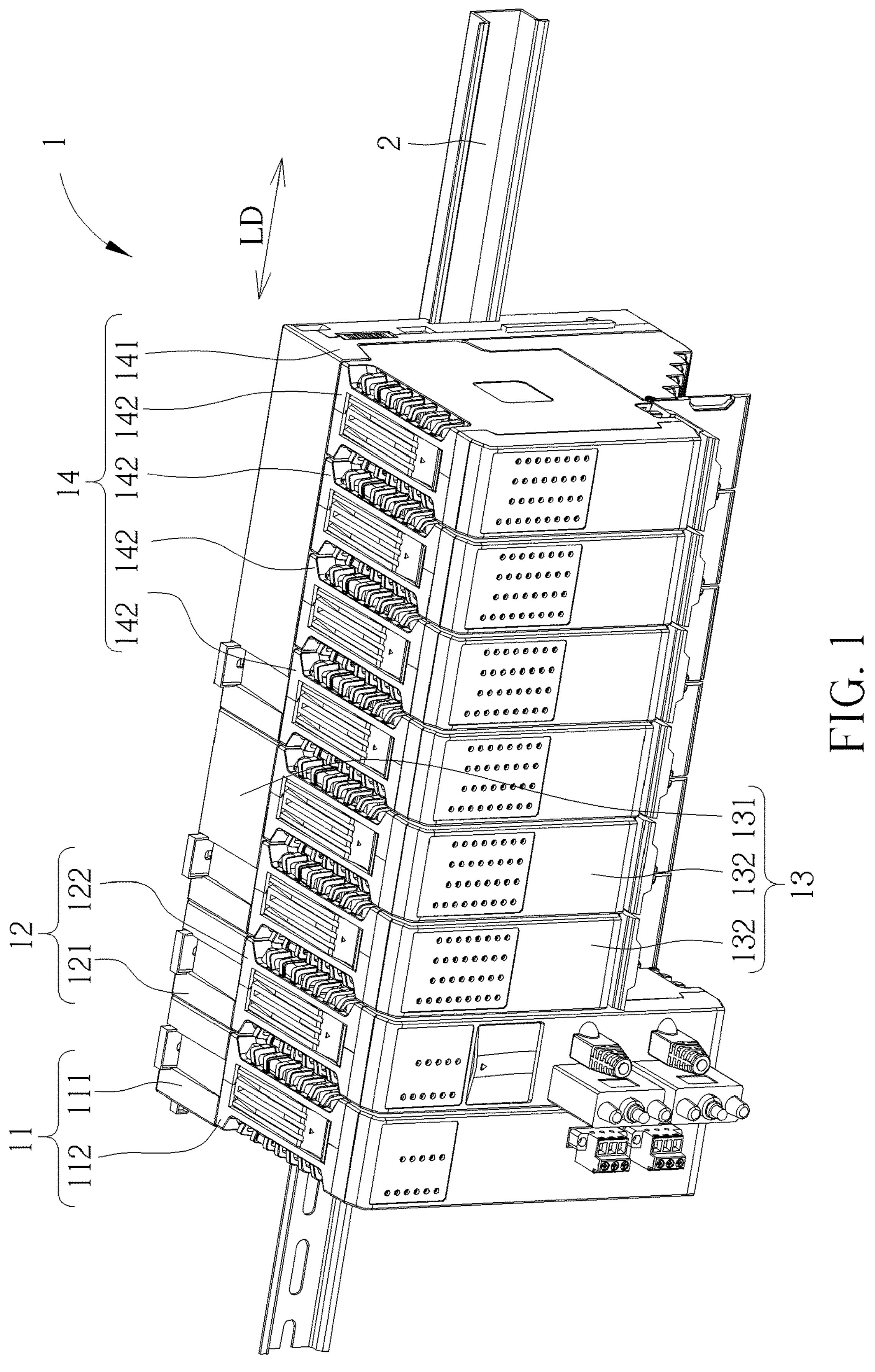
FIG. 1 and FIG. 2 are diagrams of a rail mounting electronic device at different views according to a first embodiment of the present invention.
Figure 2:
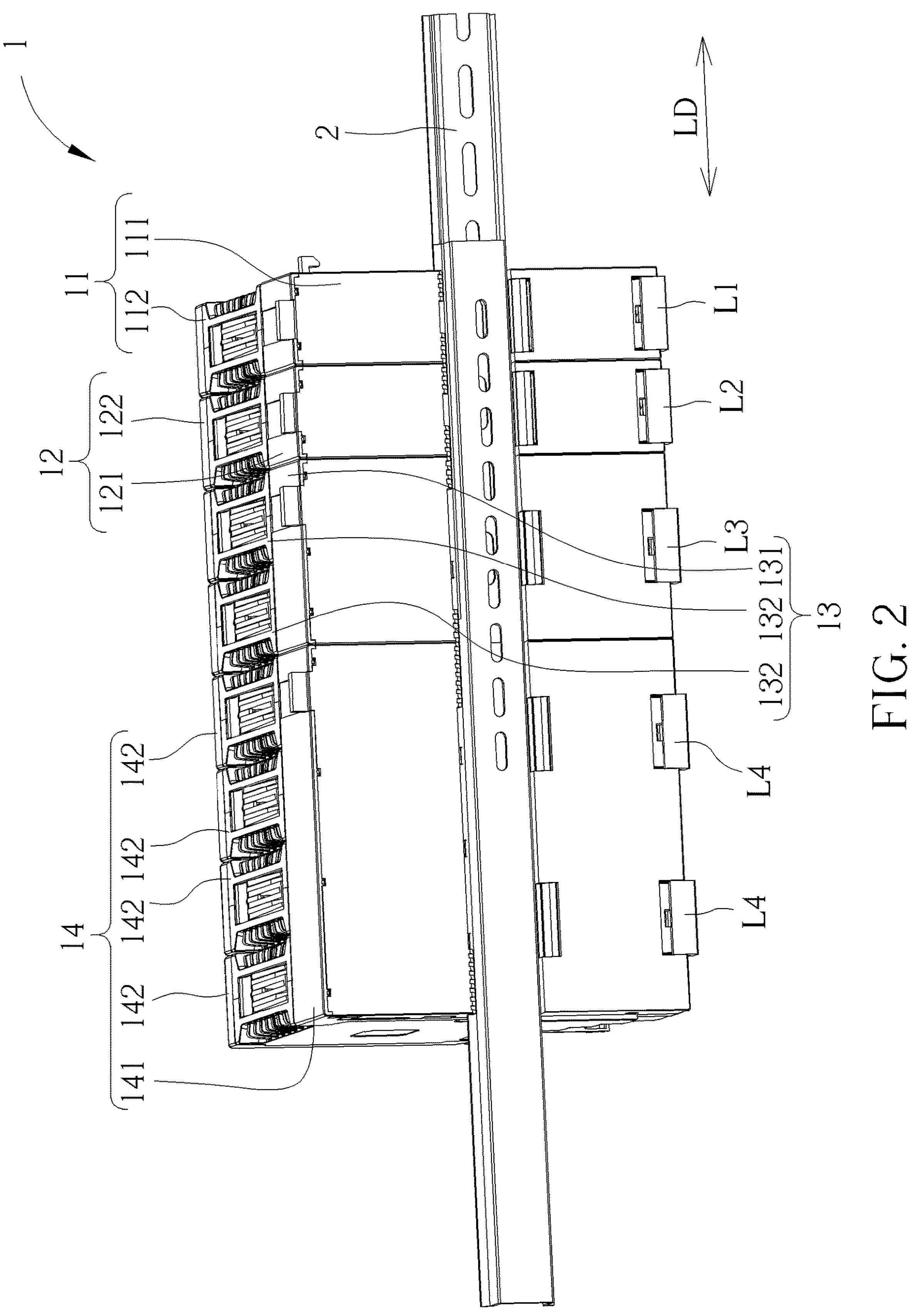
Figure 3:
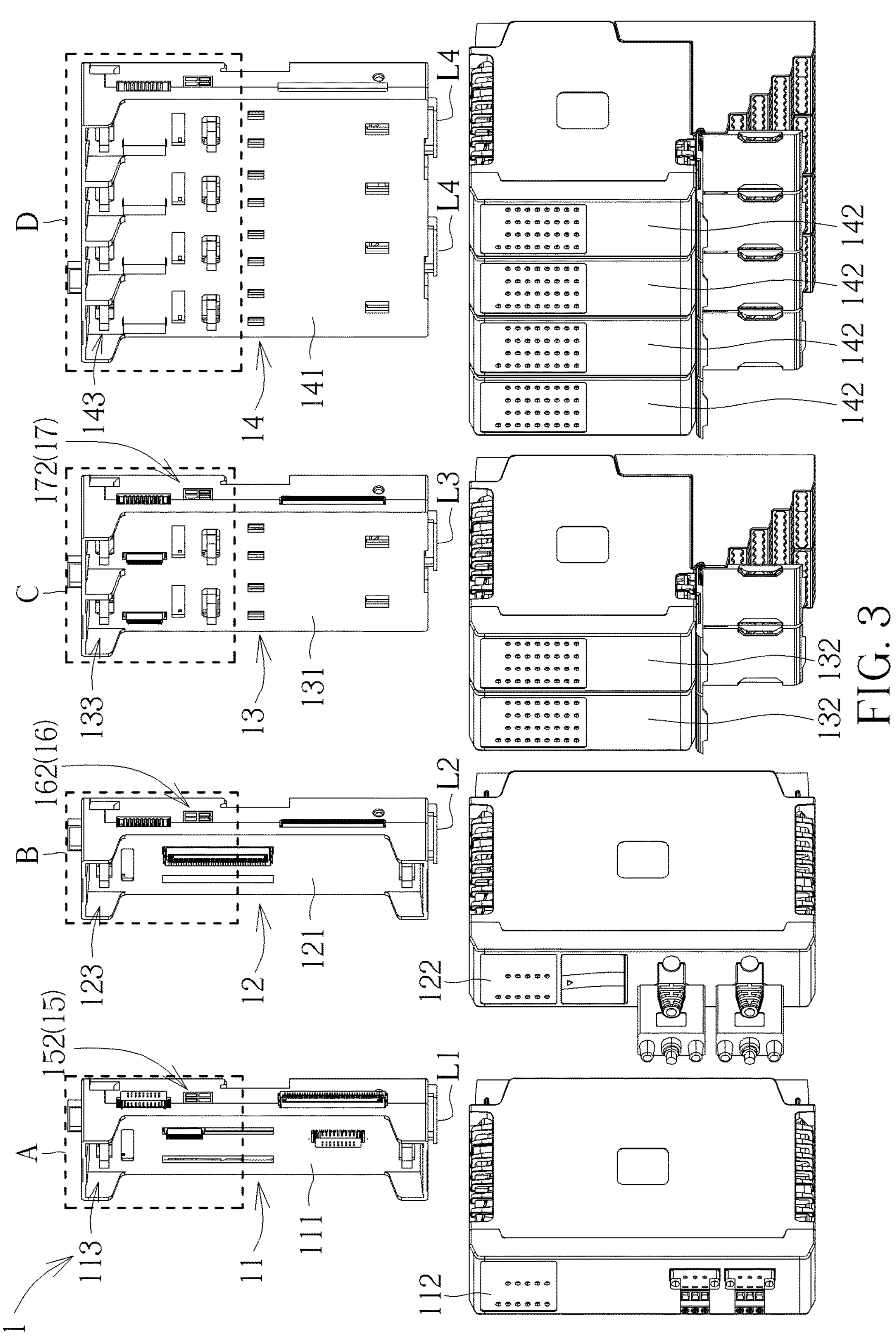
FIG. 3 and FIG. 4 are exploded diagrams of the rail mounting electronic device at different views according to the first embodiment of the present invention.
Figure 4:
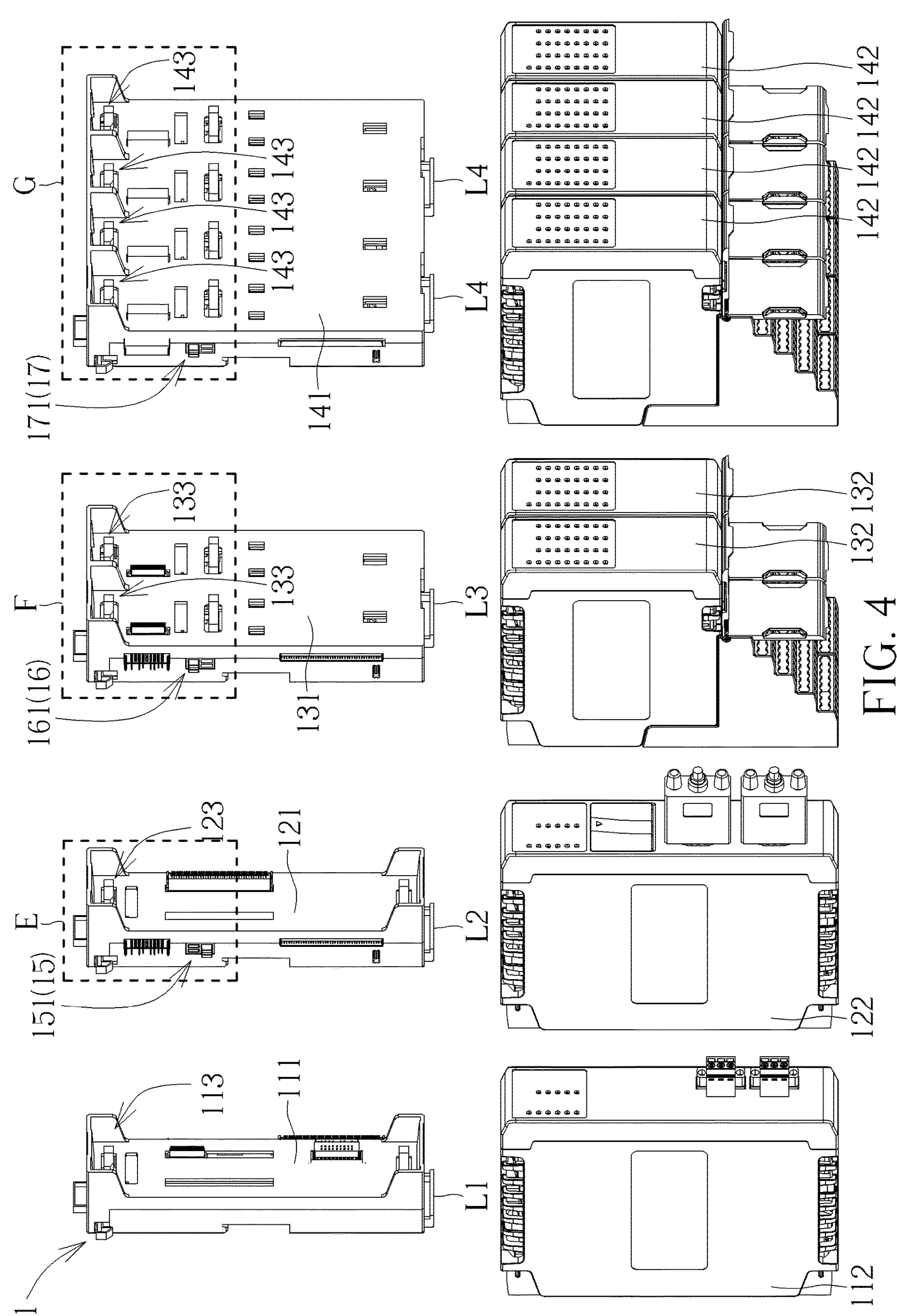

Please refer to FIG. 1 to FIG. 4. FIG. 1 and FIG. 2 are diagrams of a rail mounting electronic device 1 at different views according to a first embodiment of the present invention. FIG. 3 and FIG. 4 are exploded diagrams of the rail mounting electronic device 1 at different views according to the first embodiment of the present invention. As shown in FIG. 1 to FIG. 4, the rail mounting electronic device 1 can be a remote terminal unit detachably mounted on a rail component 2, and the rail mounting electronic device 1 includes a first module 11, a second module 12, a third module 13 and a fourth module 14. The second module 12 is located between the first module 11 and the third module 13 along a lateral direction LD and electrically and structurally connected to the first module 11 and the third module 13. The third module 13 is located between the second module 12 and the fourth module 14 along the lateral direction LD and electrically and structurally connected to the second module 12 and the fourth module 14. The rail mounting electronic device 1 is in an expandable configuration. Understandably, in another embodiment, there can be more or fewer modules.

Specifically, the rail component 2, the first module 11, the second module 12, the third module 13 and the fourth module 14 can respectively be a retractable DIN rail, a power supply module, a computing module, a signal input/output module and an additional signal input/output module. However, the present invention is not limited to this embodiment. For example, in another embodiment, the first module, the second module, the third module and the fourth module can be a power supply module, a signal switch module, a computing module and a signal input/output module.

As shown in FIG. 3 and FIG. 4, the first module 11 includes a first backplane assembly 111 and a first detachable assembly 112. The second module 12 includes a second backplane assembly 121 and a second detachable assembly 122. The third module 13 includes a third backplane assembly 131 and two third detachable assembles 132. The fourth module 14 includes a fourth backplane assembly 141 and four fourth detachable assemblies 142. In this embodiment, the first backplane assembly 111, the second backplane assembly 121, the third backplane assembly 131 and the fourth backplane assembly 141 are configured to be detachably installed on the rail component 2, e.g., by a first locking component L1 movably mounted on the first backplane assembly 111, a second locking component L2 movably mounted on the second backplane assembly 121, a third locking component L3 movably mounted on the third backplane assembly 131 and two fourth locking components L4 movably mounted on the fourth backplane assembly 141, respectively, and the first detachable assembly 112, the second detachable assembly 122, each of the two third detachable assemblies 132 and each of the four fourth detachable assemblies 142 are detachably assembled with the first backplane assembly 111, the second backplane assembly 121, the third backplane assembly 131 and the fourth backplane assembly 141 by a first locking assembly 113, a second locking assembly 123, a third locking assembly 133 and a fourth locking assembly 143, respectively.

Figure 5:
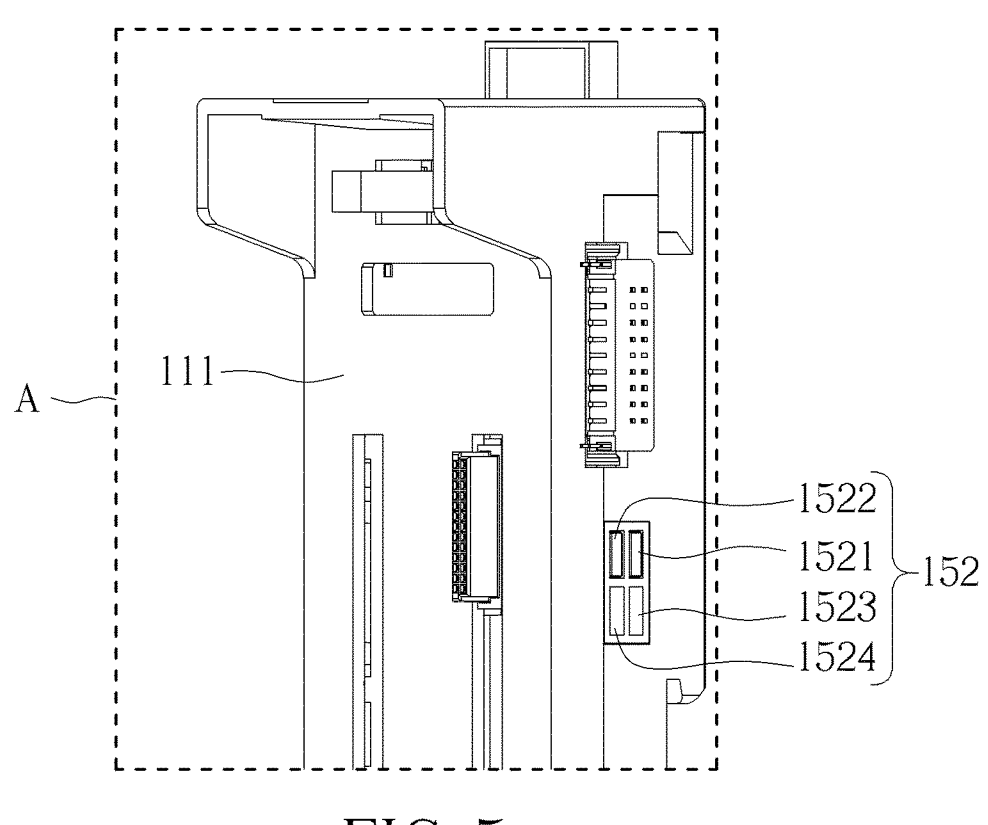
FIG. 5 is an enlarged diagram of an A portion of the rail mounting electronic device shown in FIG. 3 according to the first embodiment of the present invention.
Figure 6:
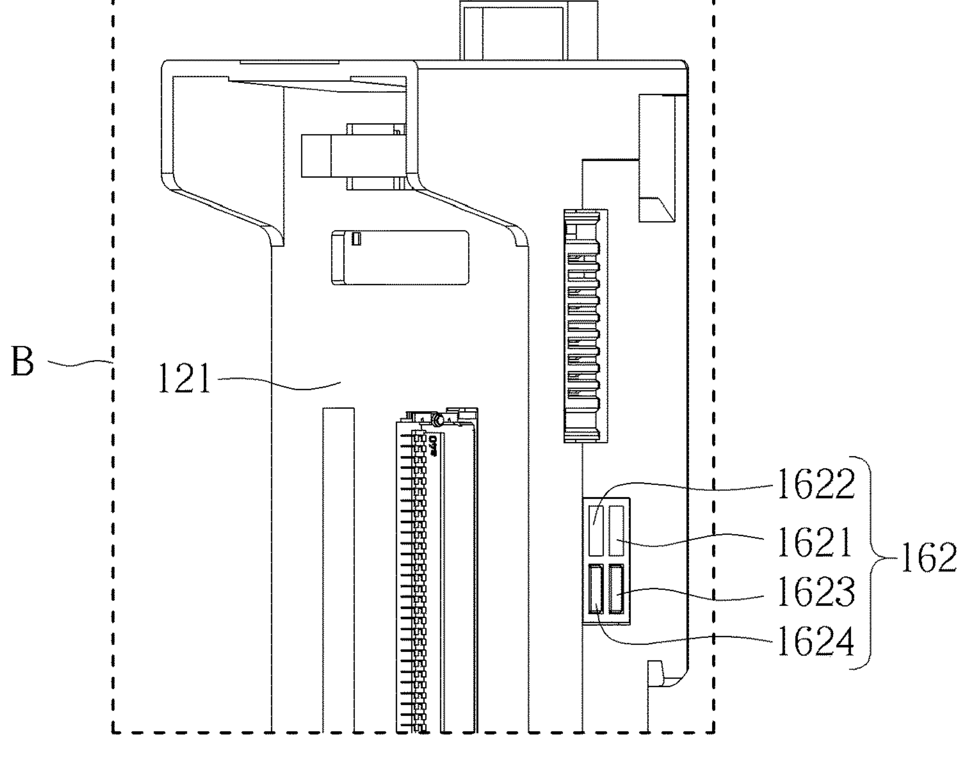
FIG. 6 is an enlarged diagram of a B portion of the rail mounting electronic device shown in FIG. 3 according to the first embodiment of the present invention.
Figure 7:
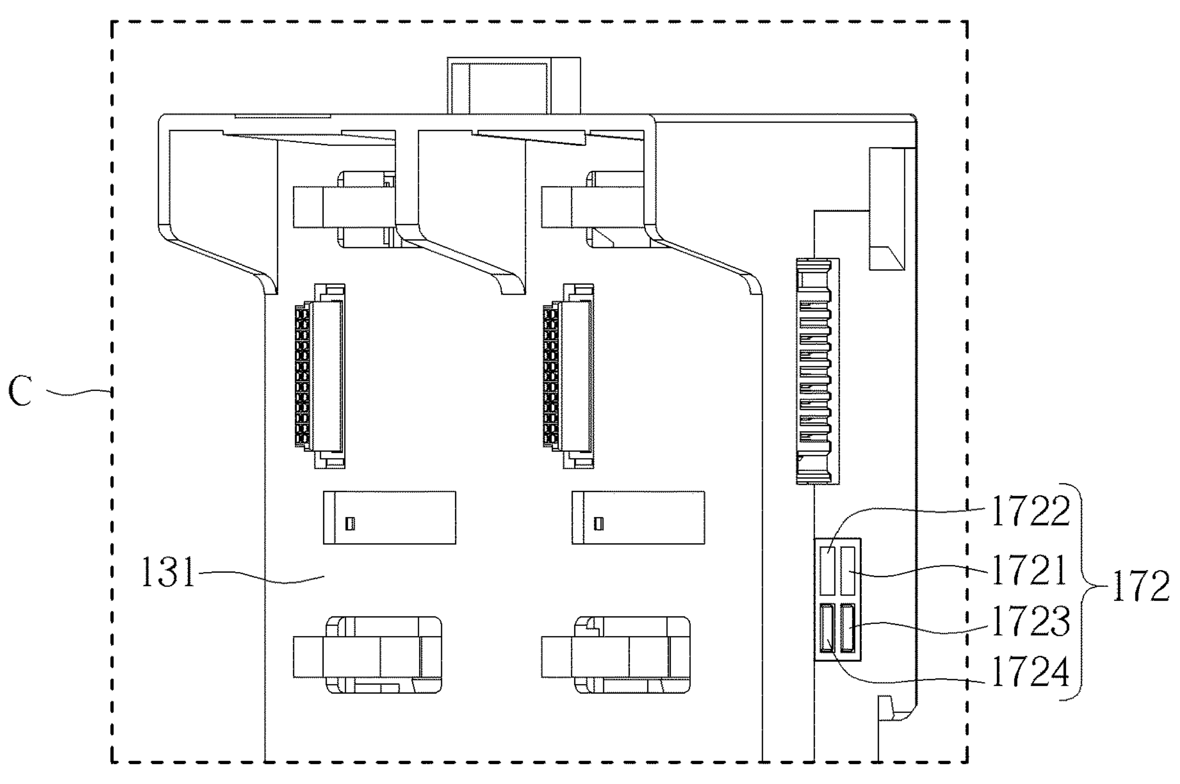
FIG. 7 is an enlarged diagram of a C portion of the rail mounting electronic device shown in FIG. 3 according to the first embodiment of the present invention.
Figure 8:
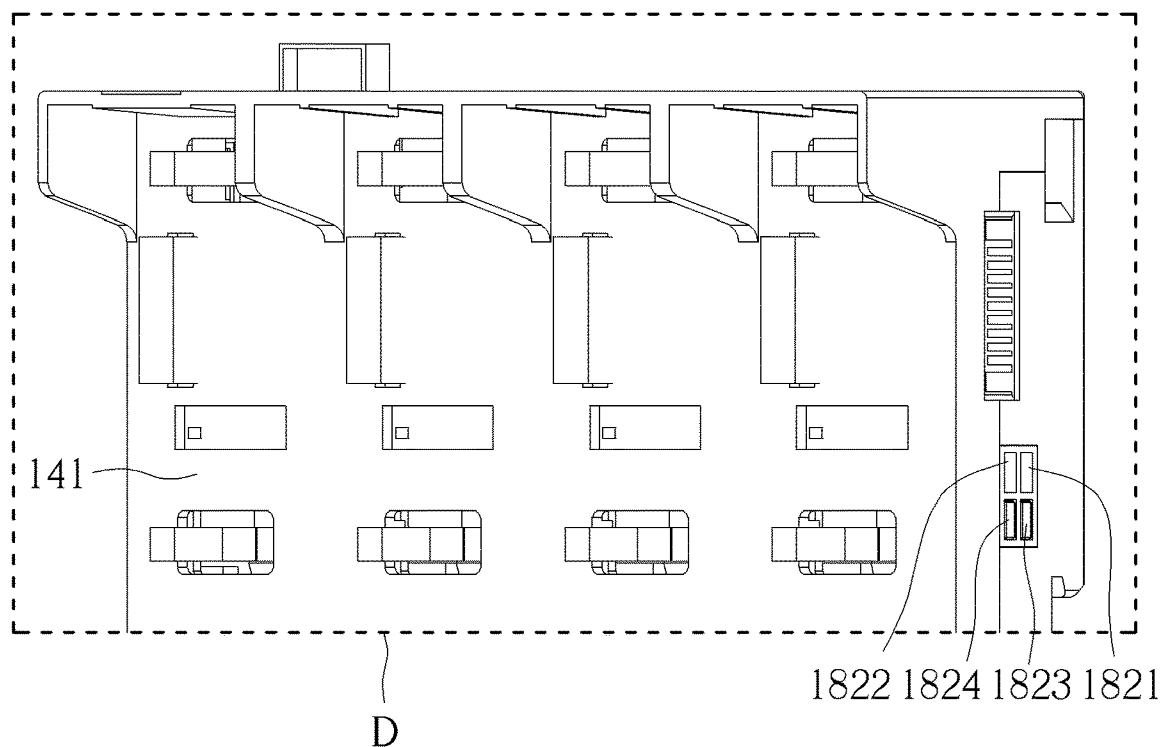
FIG. 8 is an enlarged diagram of a D portion of the rail mounting electronic device shown in FIG. 3 according to the first embodiment of the present invention.
Figure 9:
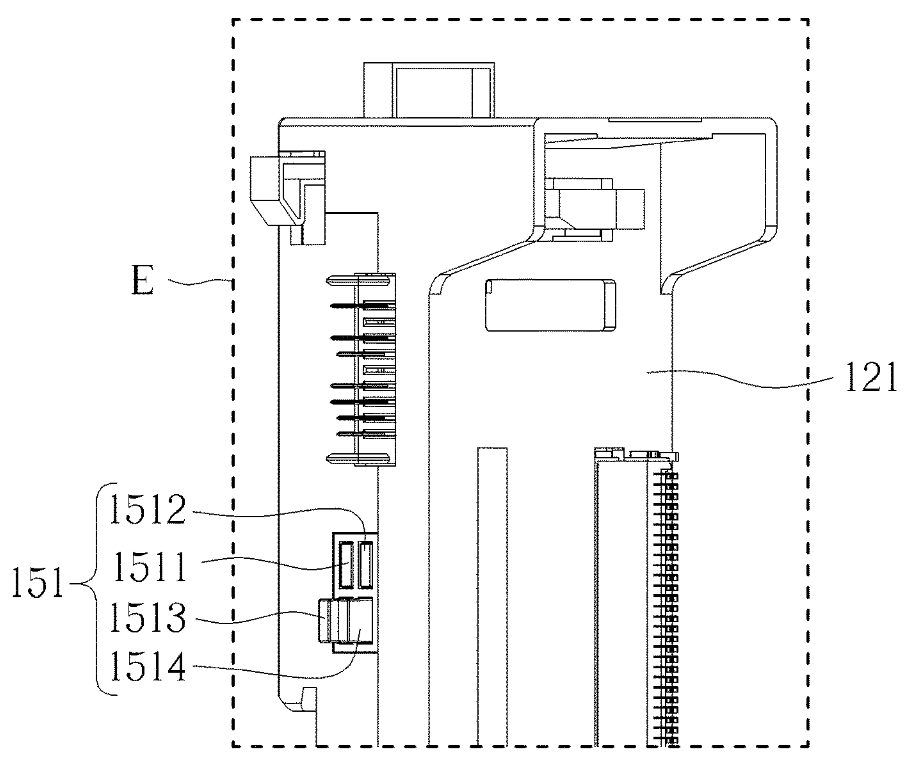
FIG. 9 is an enlarged diagram of an E portion of the rail mounting electronic device shown in FIG. 4 according to the first embodiment of the present invention.
Figure 10:
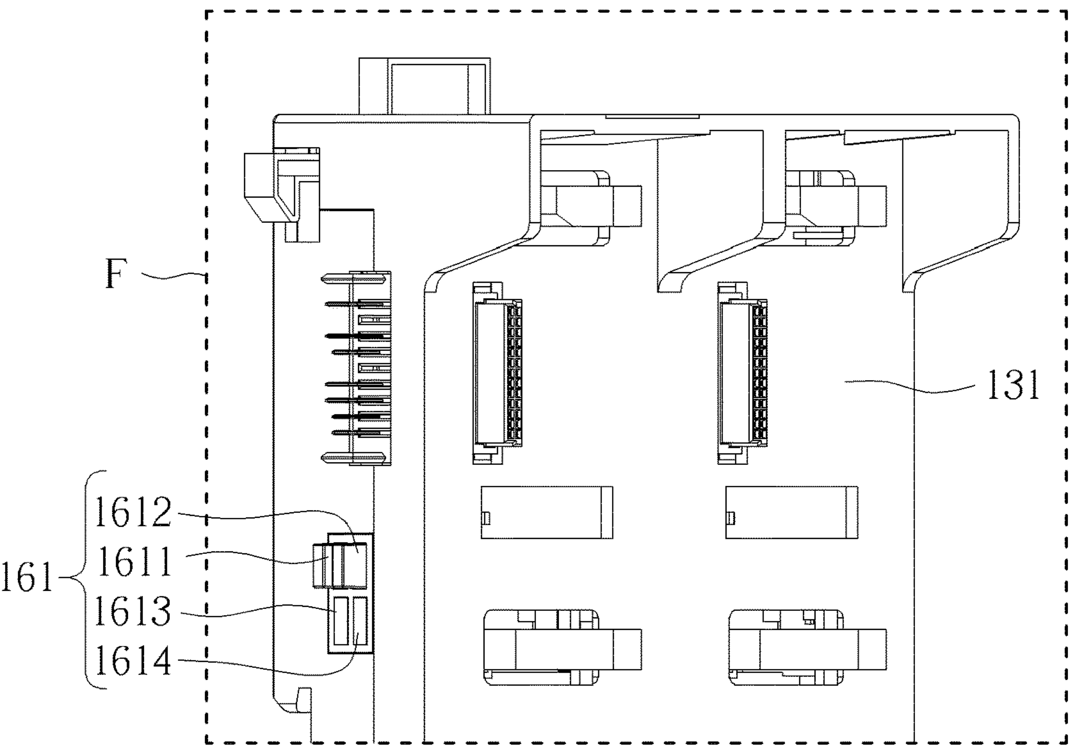
FIG. 10 is an enlarged diagram of an F portion of the rail mounting electronic device shown in FIG. 4 according to the first embodiment of the present invention.
Figure 11:
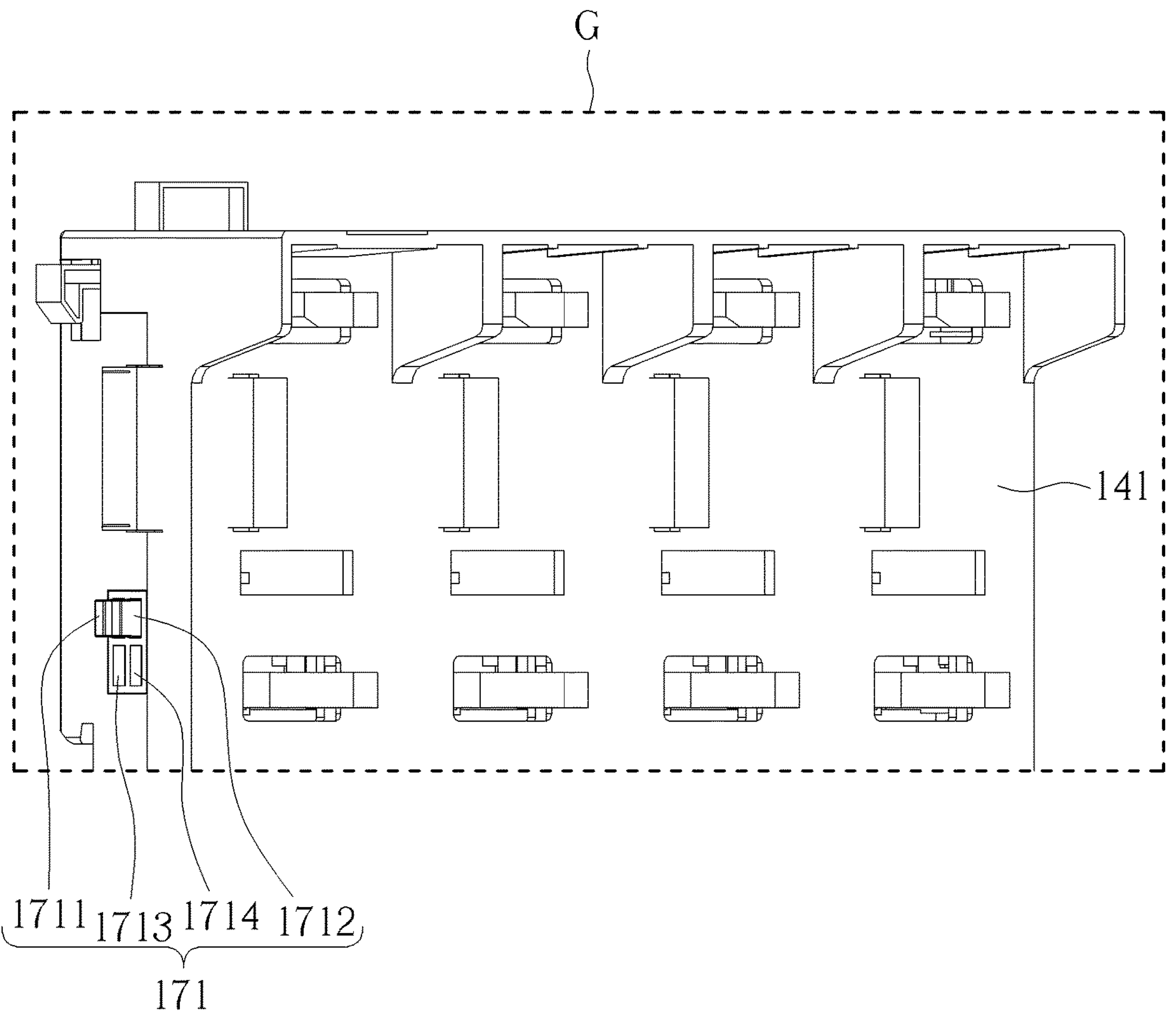
FIG. 11 is an enlarged diagram of a G portion of the rail mounting electronic device shown in FIG. 4 according to the first embodiment of the present invention.

Please refer to FIG. 3 to FIG. 11. FIG. 5 is an enlarged diagram of an A portion of the rail mounting electronic device 1 shown in FIG. 3 according to the first embodiment of the present invention. FIG. 6 is an enlarged diagram of a B portion of the rail mounting electronic device 1 shown in FIG. 3 according to the first embodiment of the present invention. FIG. 7 is an enlarged diagram of a C portion of the rail mounting electronic device 1 shown in FIG. 3 according to the first embodiment of the present invention. FIG. 8 is an enlarged diagram of a D portion of the rail mounting electronic device 1 shown in FIG. 3 according to the first embodiment of the present invention. FIG. 9 is an enlarged diagram of an E portion of the rail mounting electronic device 1 shown in FIG. 4 according to the first embodiment of the present invention. FIG. 10 is an enlarged diagram of an F portion of the rail mounting electronic device 1 shown in FIG. 4 according to the first embodiment of the present invention. FIG. 11 is an enlarged diagram of a G portion of the rail mounting electronic device 1 shown in FIG. 4 according to the first embodiment of the present invention. As shown in FIG. 3 and FIG. 4, the rail mounting electronic device 1 further includes a first mating module 15, a second mating module 16 and a third mating module 17 for ensuring connections among the first module 11, the second module 12, the third module 13 and the fourth module 14. As shown in FIG. 3, FIG. 4, FIG. 5 and FIG. 9, the first mating module 15 is disposed between the first module 11 and the second module 12. The first mating module 15 includes a first mating structure 151 and a first cooperating structure 152. The first mating structure 151 is formed on a left side of the second backplane assembly 121 of the second module 12. The first mating structure 151 includes four first mating features 1511, 1512, 1513, 1514. The two upper first mating features 1511, 1512 are two first flat mating features. The two lower first mating features 1513, 1514 are two first protruding mating features. The first cooperating structure 152 is formed on a right side of the first backplane assembly 111 of the first module 11. The first cooperating structure 152 includes four first cooperating features 1521, 1522, 1523, 1524. The two upper first cooperating features 1521, 1522 are two first flat cooperating features. The two lower first cooperating features 1523, 1524 are two first recessed cooperating features. When the second backplane assembly 121 of the second module 12 is to be assembled with the right side of the first backplane assembly 111 of the first module 11, the two lower first mating features 1513, 1514 are configured to respectively stretch into the two lower first cooperating features 1523, 1524 for allowing the second backplane assembly 121 of the second module 12 to be assembled with the right side of the first backplane assembly 111 of the first module 11 without any obstruction.

Preferably, in this embodiment, the four first mating features 1511, 1512, 1513, 1514 are arranged in a 2×2 matrix, and the four first cooperating features 1521, 1522, 1523, 1524 are arranged in a 2×2 matrix. However, the present invention is not limited to this embodiment. For example, in another embodiment, the four first mating features can be arranged in a line, and the four first cooperating features can be arranged in a line.

As shown in FIG. 3, FIG. 4, FIG. 6 and FIG. 10, the second mating module 16 is disposed between the second module 12 and the third module 13. The second mating module 16 includes a second mating structure 161 and a second cooperating structure 162. The second mating structure 161 is formed on a left side of the third backplane assembly 131 of the third module 13. The second mating structure 161 includes four second mating features 1611, 1612, 1613, 1614. The two upper second mating features 1611, 1612 are two second protruding mating features. The two lower second mating features 1613, 1614 are two second recessed mating features. The second cooperating structure 162 is formed on a right side of the second backplane assembly 121 of the second module 12. The second cooperating structure 162 includes four second cooperating features 1621, 1622, 1623, 1624. The two upper second cooperating features 1621, 1622 are two second recessed cooperating features. The two lower second cooperating features 1623, 1624 are two second flat cooperating features. When the third backplane assembly 131 of the third module 13 is to be assembled with the right side of the second backplane assembly 121 of the second module 12, the two upper second mating features 1611, 1612 are configured to respectively stretch into the two upper second cooperating features 1621, 1622 for allowing the third backplane assembly 131 of the third module 13 to be assembled with the right side of the second backplane assembly 121 of the second module 12 without any obstruction.

Preferably, in this embodiment, the four second mating features 1611, 1612, 1613, 1614 are arranged in a 2×2 matrix, and the four second cooperating features 1621, 1622, 1623, 1624 are arranged in a 2×2 matrix. However, the present invention is not limited to this embodiment. For example, in another embodiment, the four second mating features can be arranged in a line, and the four second cooperating features can be arranged in a line.

As shown in FIG. 3, FIG. 4, FIG. 7 and FIG. 11, the third mating module 17 is disposed between the third module 13 and the fourth module 14. The third mating module 17 includes a third mating structure 171 and a third cooperating structure 172. The third mating structure 171 is formed on a left side of the fourth backplane assembly 141 of the fourth module 14. The third mating structure 171 includes four third mating features 1711, 1712, 1713, 1714. The two upper third mating features 1711, 1712 are two third protruding mating features. The two lower third mating features 1713, 1714 are two third recessed mating features. The third cooperating structure 172 is formed on a right side of the third backplane assembly 131 of the third module 13. The third cooperating structure 172 includes four third cooperating features 1721, 1722, 1723, 1724. The two upper third cooperating features 1721, 1722 are two third recessed cooperating features. The two lower third cooperating features 1723, 1724 are two third flat cooperating features. When the fourth backplane assembly 141 of the fourth module 14 is to be assembled with the right side of the third backplane assembly 131 of the third module 13, the two upper third mating features 1711, 1712 are configured to respectively stretch into the two upper third cooperating features 1721, 1722 for allowing the fourth backplane assembly 141 of the fourth module 14 to be assembled with the right side of the third backplane assembly 131 of the third module 13 without any obstruction.

Preferably, in this embodiment, the four third mating features 1711, 1712, 1713, 1714 are arranged in a 2×2 matrix, and the four third cooperating features 1721, 1722, 1723, 1724 are arranged in a 2×2 matrix. However, the present invention is not limited to this embodiment. For example, in another embodiment, the four third mating features can be arranged in a line, and the four third cooperating features can be arranged in a line.

It should be noticed that as shown in FIG. 5 and FIG. 10, when the third backplane assembly 131 of the third module 13 is to be assembled with the right side of the first backplane assembly 111 of the first module 11 by mistake, the two upper second mating features 1611, 1612 are configured to respectively abut against the two upper first cooperating features 1521, 1522 for preventing the third backplane assembly 131 of the third module 13 from being assembled with the right side of the first backplane assembly 111 of the first module 11. As shown in FIG. 7 and FIG. 9, when the second backplane assembly 121 of the second module 12 is to be assembled with the right side of the third backplane assembly 131 of the third module 13 by mistake, the two lower first mating features 1513, 1514 are configured to respectively abut against the two lower third cooperating features 1723, 1724 for preventing the second backplane assembly 121 of the second module 12 from being assembled with the right side of the third backplane assembly 131 of the third module 13.

In addition, as shown in FIG. 8, four fourth cooperating features 1821, 1822, 1823, 1824 are disposed on a right side of the fourth backplane assembly 141 of the fourth module 14 for allowing interchanged configuration of the third module 13 and the fourth module 14, i.e., allowing the fourth backplane assembly 141 of the fourth module 14 and the third backplane assembly 131 of the third module 13 to be respectively assembled with the right side of the second backplane assembly 121 of the second module 12 and the right side of the fourth backplane assembly 141 of the fourth module 14. Specifically, the two upper fourth cooperating features 1821, 1822 are two fourth recessed cooperating features, and the two lower fourth cooperating features 1823, 1824 are two fourth flat cooperating features. As shown in FIG. 6 and FIG. 11, when the fourth backplane assembly 141 of the fourth module 14 is to be assembled with the right side of the second backplane assembly 121 of the second module 12, the two upper third mating features 1711, 1712 are configured to respectively stretch into the two upper second cooperating features 1621, 1622 for allowing the fourth backplane assembly 141 of the fourth module 14 to be assembled with the right side of the second backplane assembly 121 of the second module 12 without any obstruction. As shown in FIG. 8 and FIG. 10, when the third backplane assembly 131 of the third module 13 is to be assembled with the right side of the fourth backplane assembly 141 of the fourth module 14, the two lower second mating features 1613, 1614 are configured to respectively stretch into the two lower fourth cooperating features 1823, 1824 for allowing the third backplane assembly 131 of the third module 13 to be assembled with the right side of the fourth backplane assembly 141 of the fourth module 14 without any obstruction. On the other hand, as shown in FIG. 8 and FIG. 9, when the second backplane assembly 121 of the second module 12 is to be assembled with the right side of the fourth backplane assembly 141 of the fourth module 14 by mistake, the two lower first mating features 1513, 1514 are configured to respectively abut against the two lower fourth cooperating features 1823, 1824 for preventing the second backplane assembly 121 of the second module 12 from being assembled with the right side of the fourth backplane assembly 141 of the fourth module 14.

Figure 12:
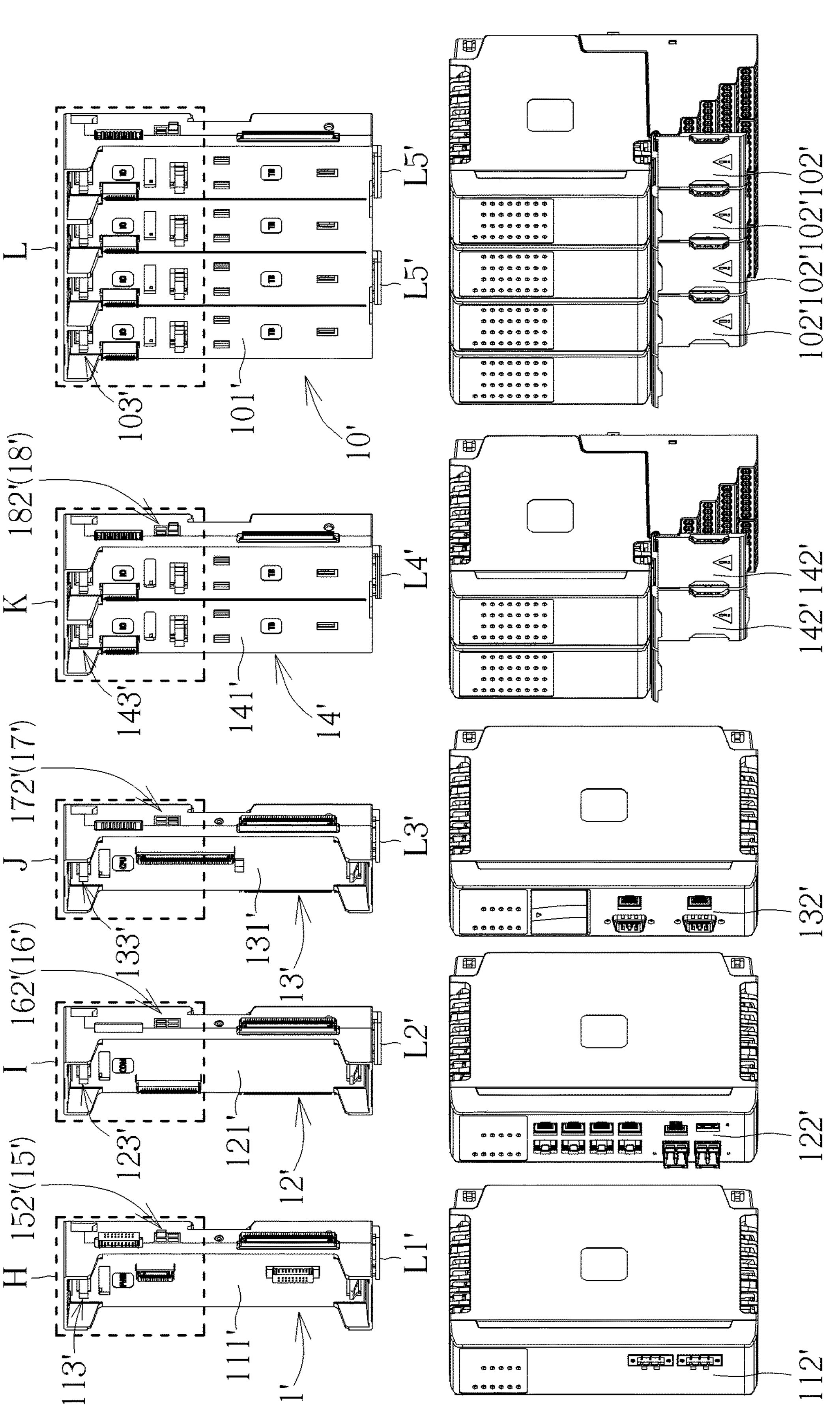
FIG. 12 and FIG. 13 are exploded diagrams of a rail mounting electronic device at different views according to a second embodiment of the present invention.
Figure 13:
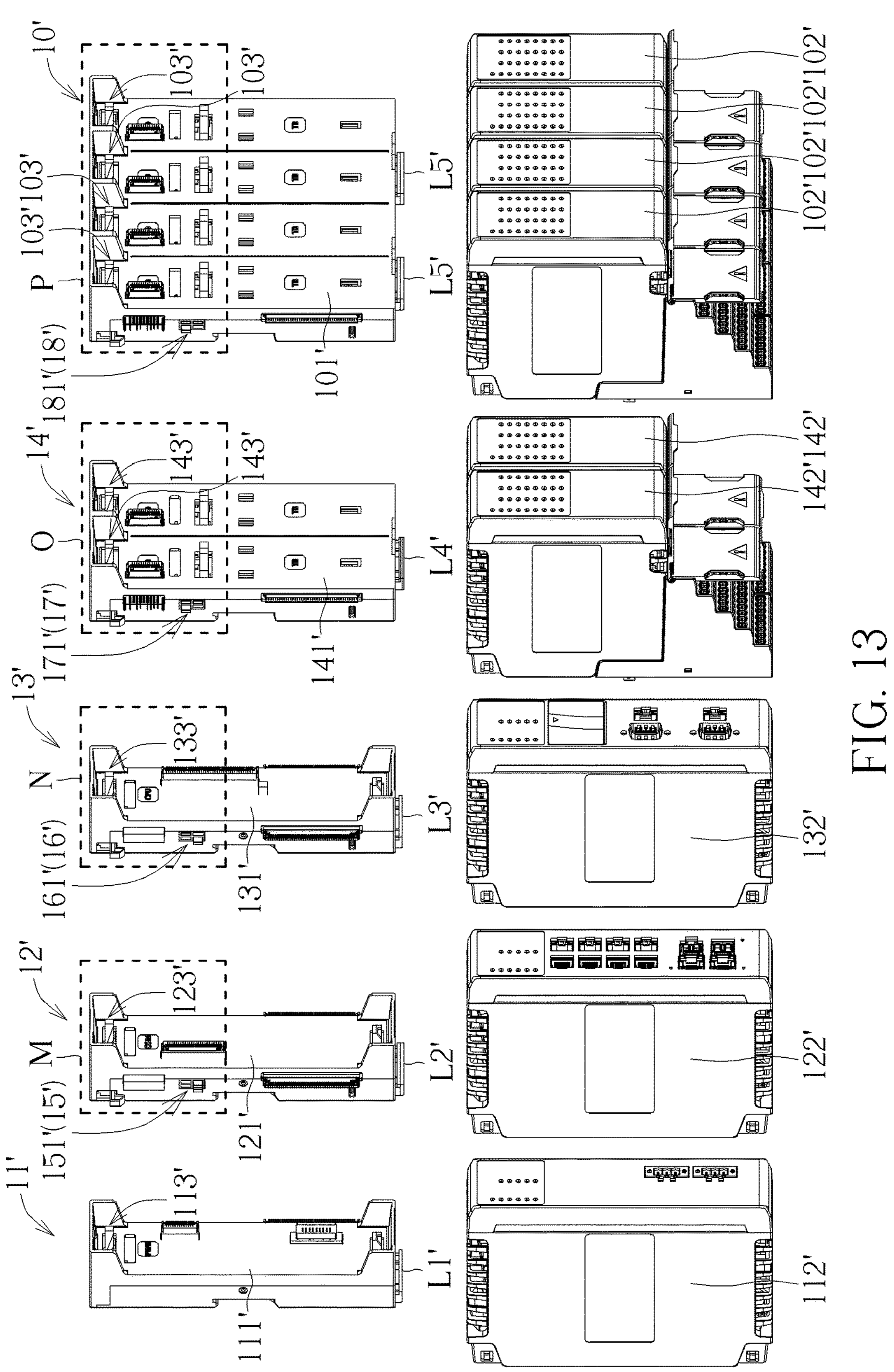
Figure 14:
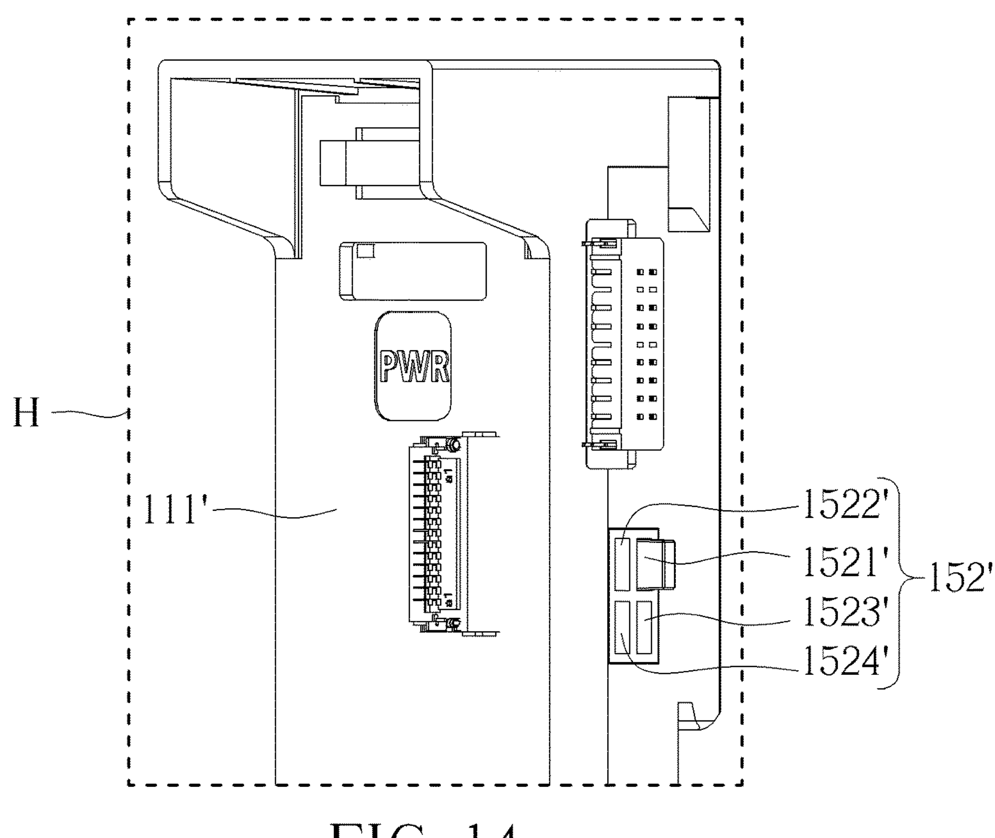
FIG. 14 is an enlarged diagram of an H portion of the rail mounting electronic device shown in FIG. 12 according to the second embodiment of the present invention.
Figure 15:
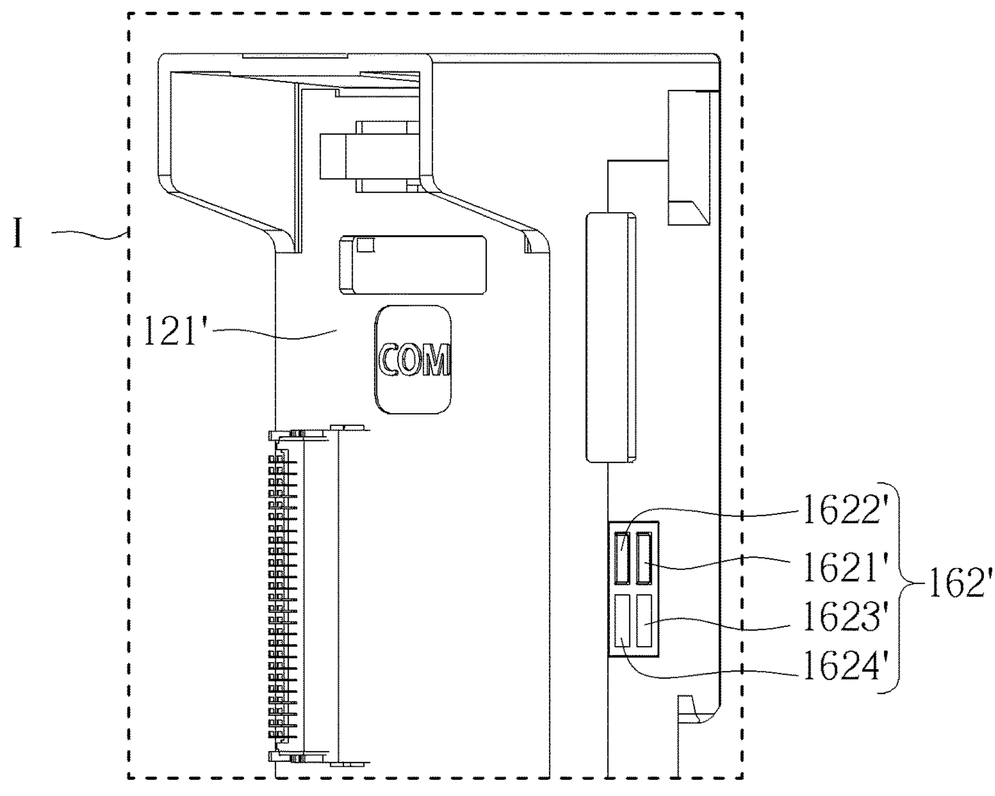
FIG. 15 is an enlarged diagram of an I portion of the rail mounting electronic device shown in FIG. 12 according to the second embodiment of the present invention.
Figure 16:
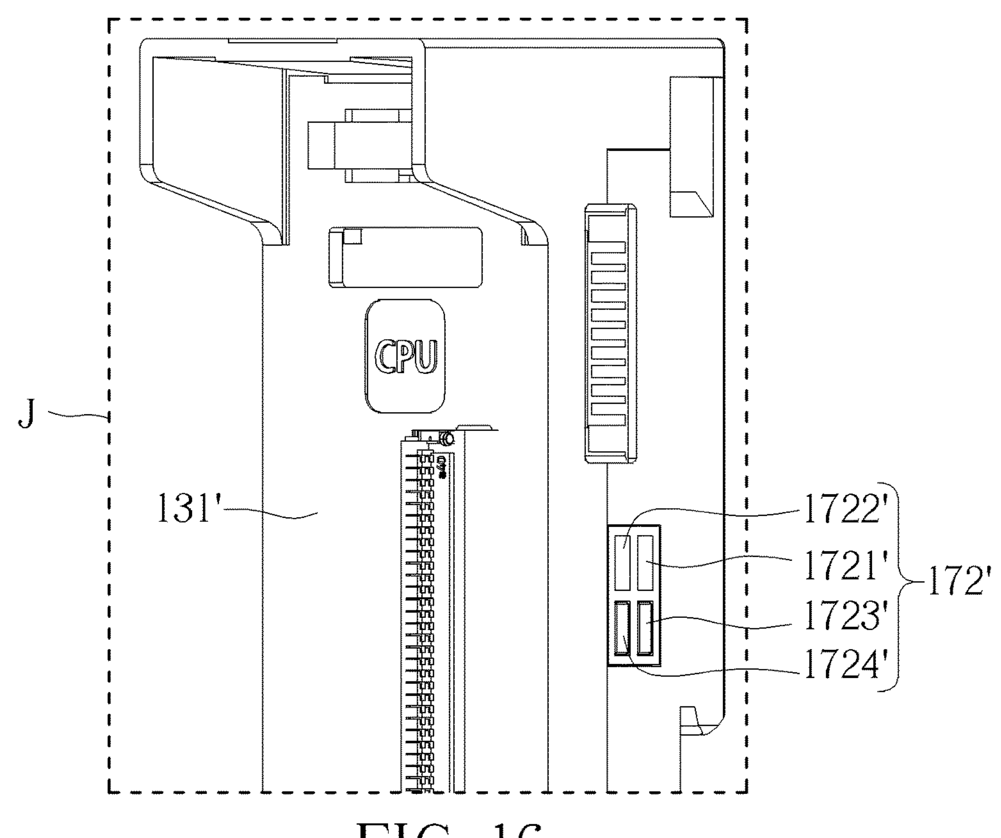
FIG. 16 is an enlarged diagram of a J portion of the rail mounting electronic device shown in FIG. 12 according to the second embodiment of the present invention.
Figure 17:
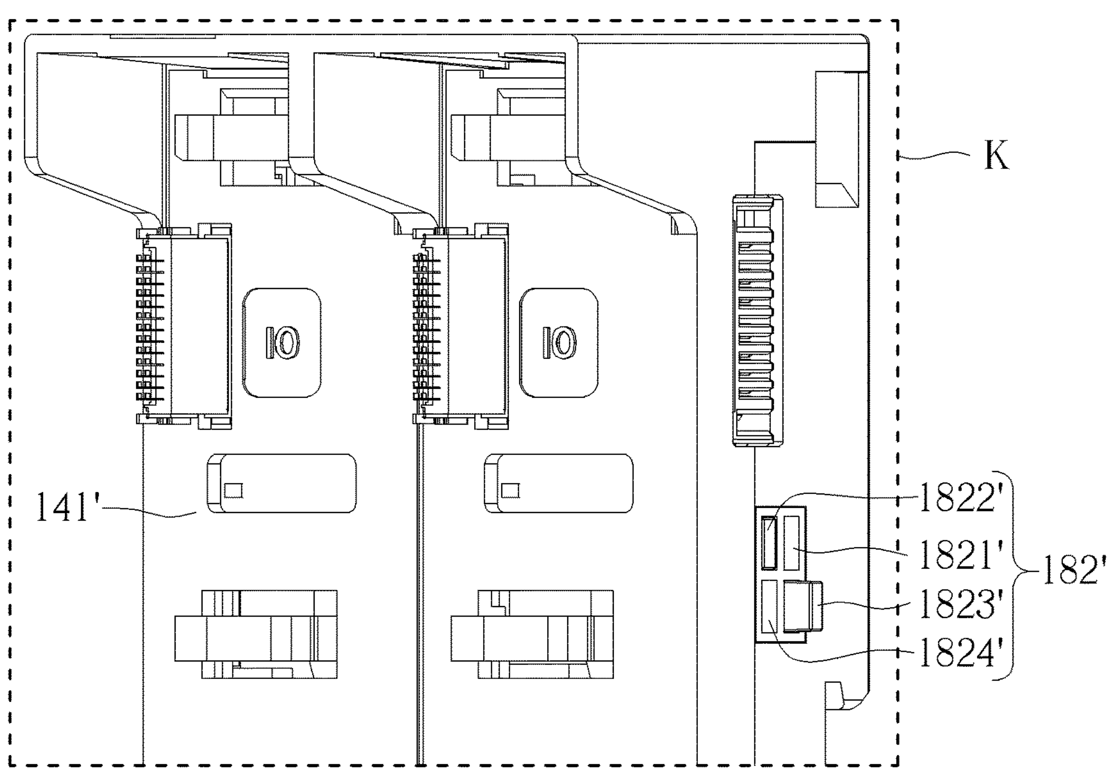
FIG. 17 is an enlarged diagram of a K portion of the rail mounting electronic device shown in FIG. 12 according to the second embodiment of the present invention.
Figure 18:
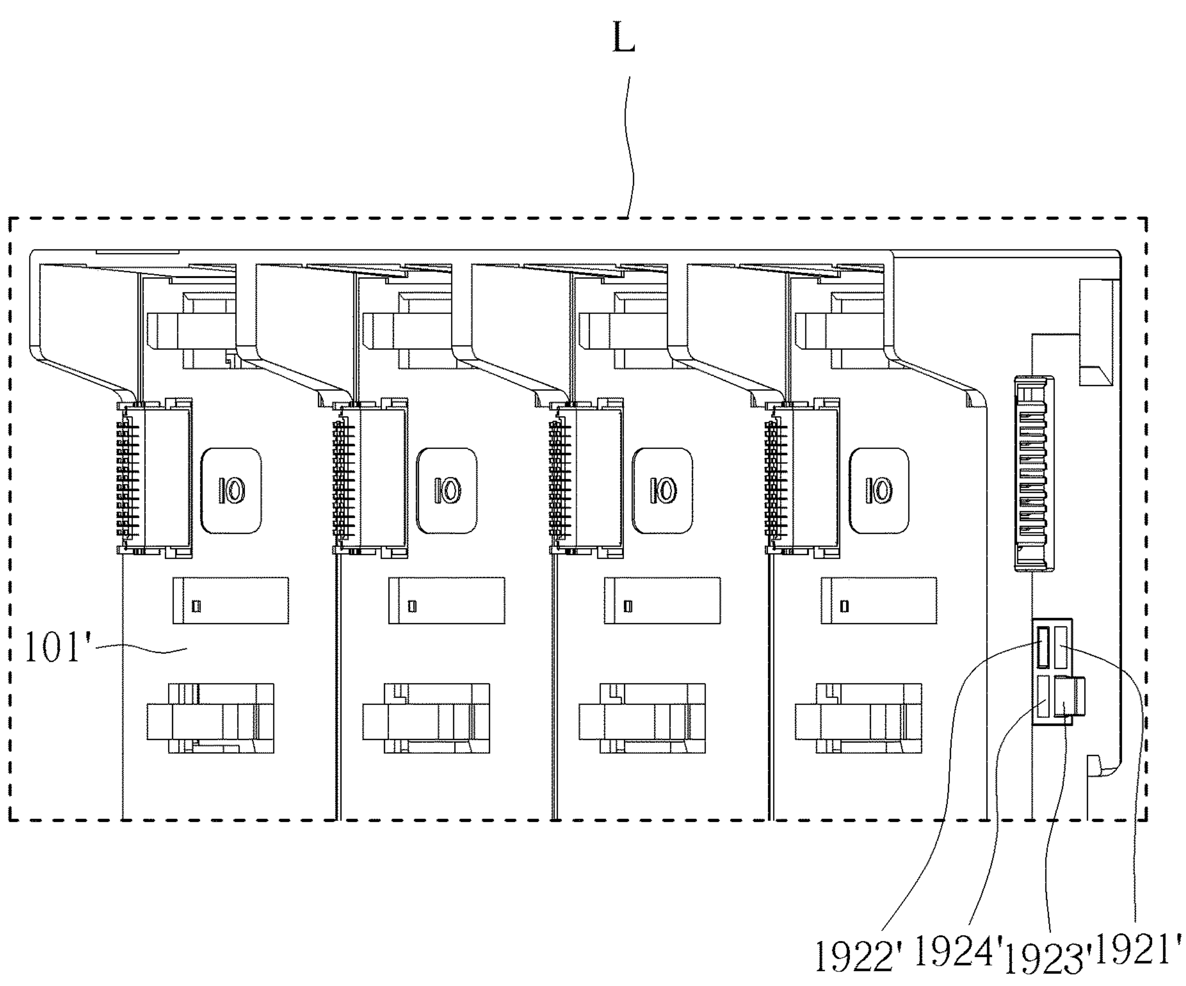
FIG. 18 is an enlarged diagram of an L portion of the rail mounting electronic device shown in FIG. 12 according to the second embodiment of the present invention.
Figure 19:
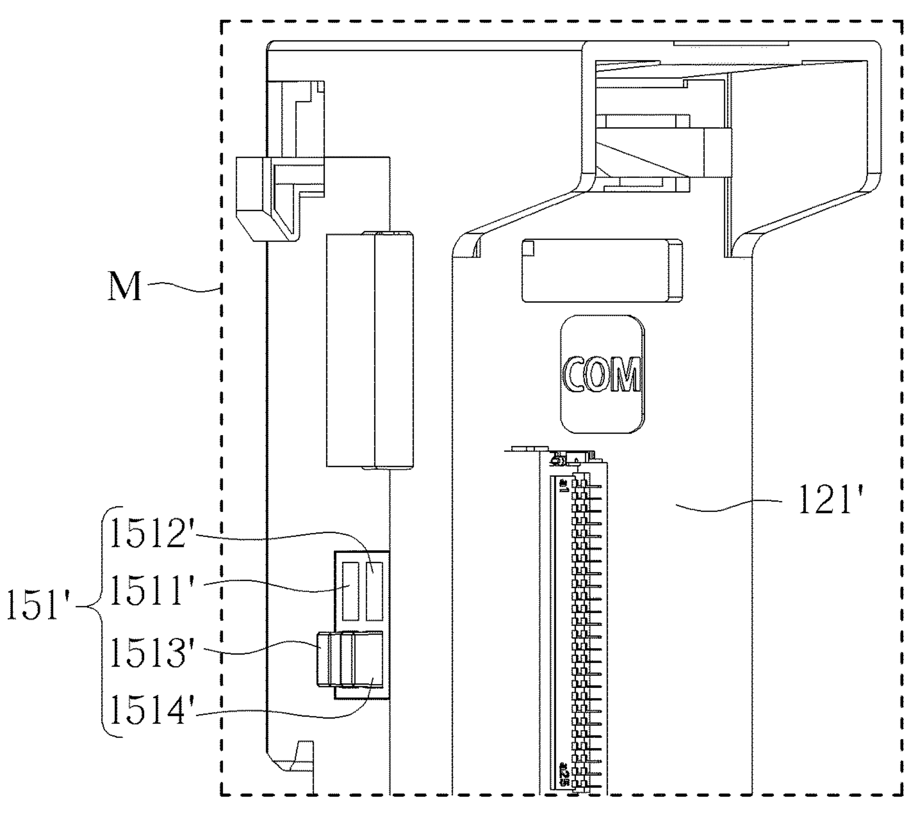
FIG. 19 is an enlarged diagram of an M portion of the rail mounting electronic device shown in FIG. 13 according to the second embodiment of the present invention.
Figure 20:
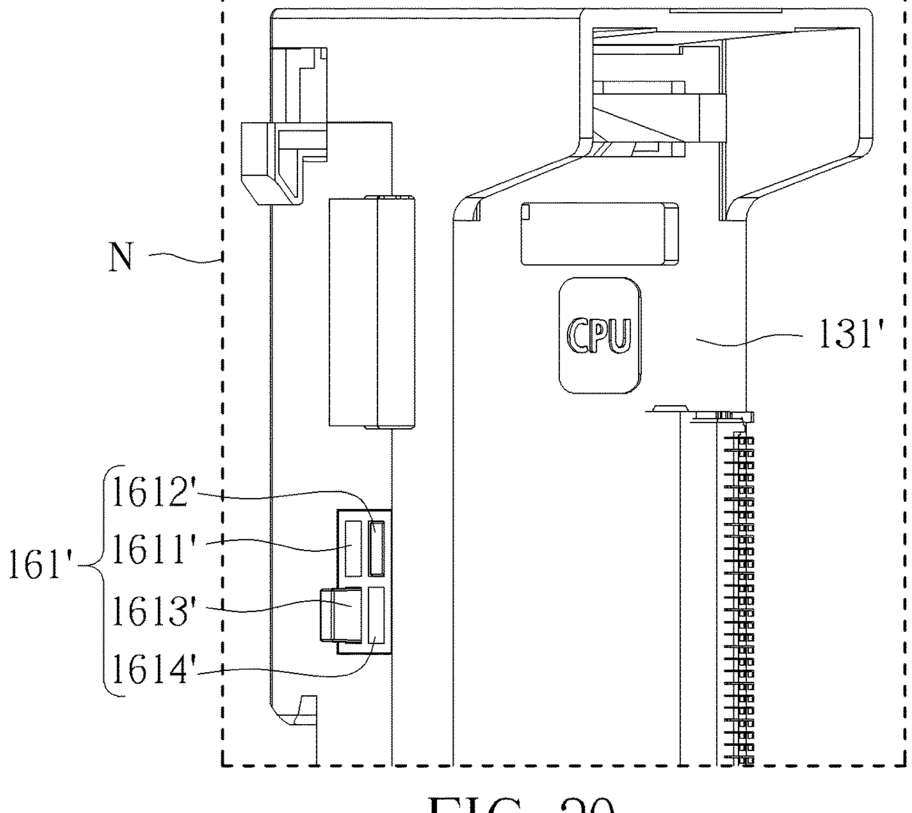
FIG. 20 is an enlarged diagram of an N portion of the rail mounting electronic device shown in FIG. 13 according to the second embodiment of the present invention.
Figure 21:
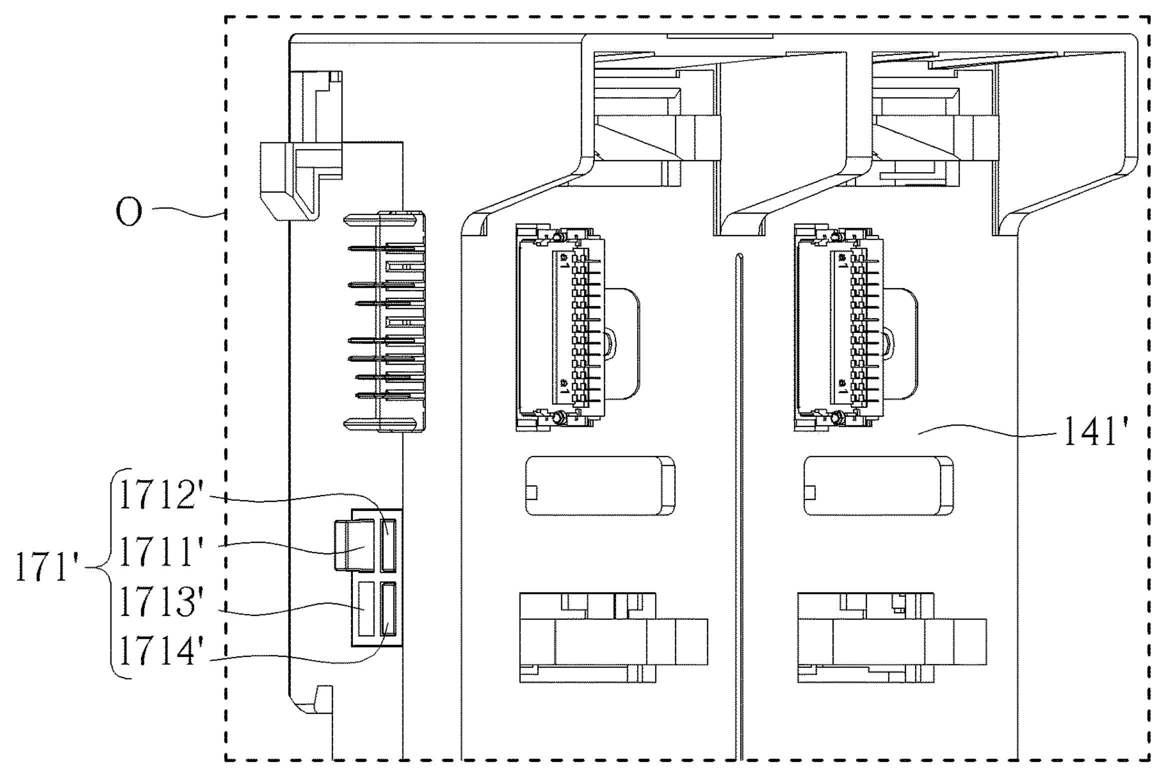
FIG. 21 is an enlarged diagram of an O portion of the rail mounting electronic device shown in FIG. 13 according to the second embodiment of the present invention.
Figure 22:
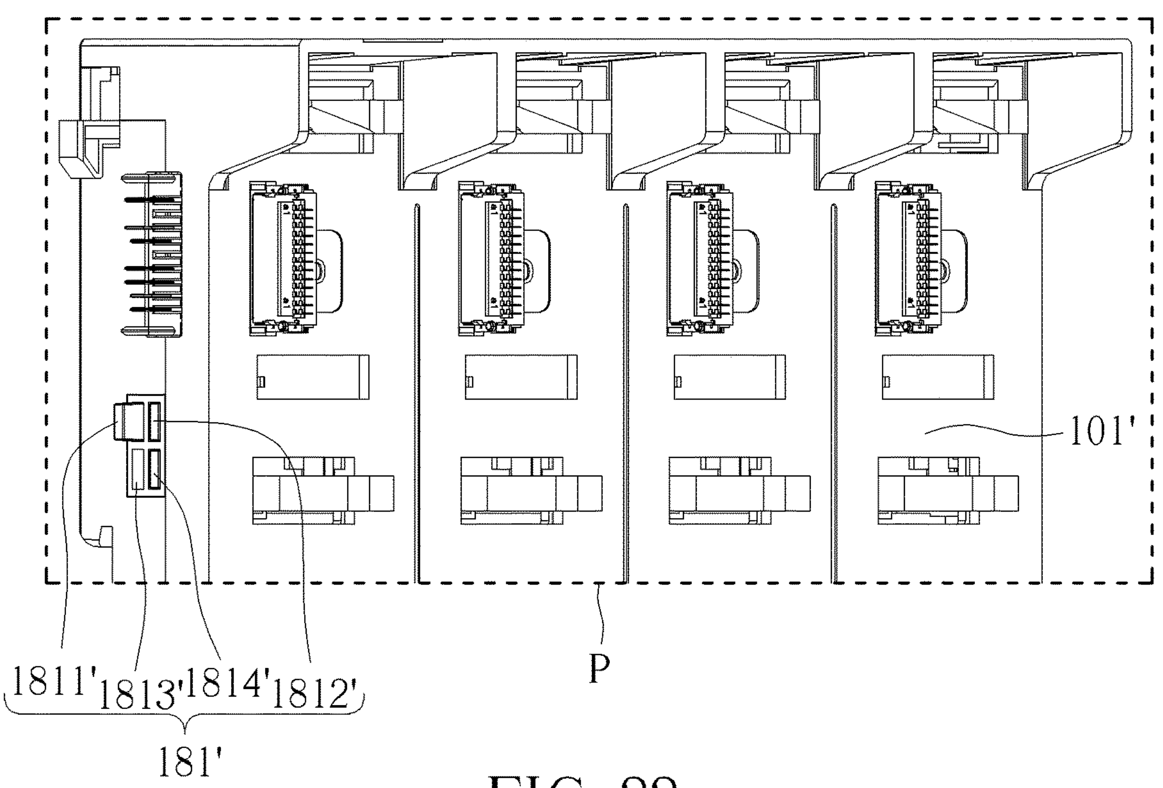
FIG. 22 is an enlarged diagram of a P portion of the rail mounting electronic device shown in FIG. 13 according to the second embodiment of the present invention.

Please refer to FIG. 12 to FIG. 22. FIG. 12 and FIG. 13 are exploded diagrams of a rail mounting electronic device 1' at different views according to a second embodiment of the present invention. FIG. 14 is an enlarged diagram of an H portion of the rail mounting electronic device 1' shown in FIG. 12 according to the second embodiment of the present invention. FIG. 15 is an enlarged diagram of an I portion of the rail mounting electronic device 1' shown in FIG. 12 according to the second embodiment of the present invention. FIG. 16 is an enlarged diagram of a J portion of the rail mounting electronic device 1' shown in FIG. 12 according to the second embodiment of the present invention. FIG. 17 is an enlarged diagram of a K portion of the rail mounting electronic device 1' shown in FIG. 12 according to the second embodiment of the present invention. FIG. 18 is an enlarged diagram of an L portion of the rail mounting electronic device 1' shown in FIG. 12 according to the second embodiment of the present invention. FIG. 19 is an enlarged diagram of an M portion of the rail mounting electronic device 1' shown in FIG. 13 according to the second embodiment of the present invention. FIG. 20 is an enlarged diagram of an N portion of the rail mounting electronic device 1' shown in FIG. 13 according to the second embodiment of the present invention. FIG. 21 is an enlarged diagram of an O portion of the rail mounting electronic device 1' shown in FIG. 13 according to the second embodiment of the present invention. FIG. 22 is an enlarged diagram of a P portion of the rail mounting electronic device 1' shown in FIG. 13 according to the second embodiment of the present invention. As shown in FIG. 12 and FIG. 13, the rail mounting electronic device 1' includes a first module 11', a second module 12', a third module 13', a fourth module 14' and a fifth module 10'. The second module 12' is located between the first module 11' and the third module 13' along the lateral direction LD and electrically and structurally connected to the first module 11' and the third module 13'. The third module 13' is located between the second module 12' and the fourth module 14' along the lateral direction LD and electrically and structurally connected to the second module 12' and the fourth module 14'. The fourth module 14' is located between the third module 13' and the fifth module 10' along the lateral direction LD and electrically and structurally connected to the third module 13' and the fifth module 10'.

Specifically, the first module 11', the second module 12', the third module 13', the fourth module 14' and the fifth module 10' can respectively be a power supply module, a signal switch module, a computing module, a signal input/output module and an additional signal input/output module. However, the present invention is not limited to this embodiment.

As shown in FIG. 12 and FIG. 13, the first module 11' includes a first backplane assembly 111' and a first detachable assembly 112'. The second module 12' includes a second backplane assembly 121' and a second detachable assembly 122'. The third module 13' includes a third backplane assembly 131' and a third detachable assembly 132'. The fourth module 14' includes a fourth backplane assembly 141' and two fourth detachable assembles 142'. The fifth module 10' includes a fifth backplane assembly 101' and four fifth detachable assemblies 102'. Similar to the first embodiment, in this embodiment, the first backplane assembly 111', the second backplane assembly 121', the third backplane assembly 131', the fourth backplane assembly 141' and the fifth backplane assembly 101' are configured to be detachably installed on the rail component 2, e.g., by a first locking component L1' movably mounted on the first backplane assembly 111', a second locking component L2' movably mounted on the second backplane assembly 121', a third locking component L3' movably mounted on the third backplane assembly 131', a fourth locking component L4' movably mounted on the fourth backplane assembly 141' and two fifth locking components L5' movably mounted on the fifth backplane assembly 101', respectively. The first detachable assembly 112', the second detachable assembly 122', the third detachable assembly 132', each of the two fourth detachable assemblies 142' and each of the fourth fifth detachable assemblies 102' are detachably assembled with the first backplane assembly 111', the second backplane assembly 121', the third backplane assembly 131', the fourth backplane assembly 141' and the fifth backplane assembly 101' by a first locking assembly 113', a second locking assembly 123', a third locking assembly 133', a fourth locking assembly 143' and a fifth locking assembly 103', respectively.

As shown in FIG. 12 and FIG. 13, the rail mounting electronic device 1' further includes a first mating module 15', a second mating module 16', a third mating module 17 and a fourth mating module 18' for ensuring connections among the first module 11', the second module 12', the third module 13', the fourth module 14' and the fifth module 10'. As shown in FIG. 12, FIG. 13, FIG. 14 and FIG. 19, the first mating module 15' is disposed between the first module 11' and the second module 12'. The first mating module 15' includes a first mating structure 151' and a first cooperating structure 152'. The first mating structure 151' is formed on a left side of the second backplane assembly 121' of the second module 12'. The first mating structure 151' includes four first mating features 1511', 1512', 1513', 1514'. The two upper first mating features 1511', 1512' are two first recessed mating features. The two lower first mating features 1513', 1514' are two first protruding mating features. The first cooperating structure 152' is formed on a right side of the first backplane assembly 111' of the first module 11'. The first cooperating structure 152' includes four first cooperating features 1521', 1522', 1523', 1524'. The two upper first cooperating features 1521', 1522' are a first protruding cooperating feature and a first recessed cooperating feature, respectively. The two lower first cooperating features 1523', 1524' are two first recessed cooperating features. When the second backplane assembly 121' of the second module 12' is to be assembled with the right side of the first backplane assembly 111' of the first module 11', the upper first cooperating feature 1521' is configured to stretch into the upper first mating feature 1511', and the two lower first mating features 1513', 1514' are configured to respectively stretch into the two lower first cooperating features 1523', 1524', so as to allow the second backplane assembly 121' of the second module 12' to be assembled with the right side of the first backplane assembly 111' of the first module 11' without any obstruction.

Preferably, in this embodiment, the four first mating features 1511', 1512', 1513', 1514' are arranged in a 2×2 matrix, and the four first cooperating features 1521', 1522', 1523', 1524' are arranged in a 2×2 matrix. However, the present invention is not limited to this embodiment. For example, in another embodiment, the four first mating features can be arranged in a line, and the four first cooperating features can be arranged in a line.

As shown in FIG. 12, FIG. 13, FIG. 15 and FIG. 20, the second mating module 16' is disposed between the second module 12' and the third module 13'. The second mating module 16' includes a second mating structure 161' and a second cooperating structure 162'. The second mating structure 161' is formed on a left side of the third backplane assembly 131' of the third module 13'. The second mating structure 161' includes four second mating features 1611', 1612', 1613', 1614'. The two upper second mating features 1611', 1612' are a second recessed mating feature and a second flat mating feature, respectively. The two lower second mating features 1613', 1614' are a second protruding mating feature and a second recessed mating feature, respectively. The second cooperating structure 162' is formed on a right side of the second backplane assembly 121' of the second module 12'. The second cooperating structure 162' includes four second cooperating features 1621', 1622', 1623', 1624'. The two upper second cooperating features 1621', 1622' are two second flat cooperating features. The two lower second cooperating features 1623', 1624' are two second recessed cooperating features. When the third backplane assembly 131' of the third module 13' is to be assembled with the right side of the second backplane assembly 121' of the second module 12', the lower second mating feature 1613' is configured to stretch into the lower second cooperating feature 1623' for allowing the third backplane assembly 131' of the third module 13' to be assembled with the right side of the second backplane assembly 121' of the second module 12' without any obstruction.

Preferably, in this embodiment, the four second mating features 1611', 1612', 1613', 1614' are arranged in a 2×2 matrix, and the four second cooperating features 1621', 1622', 1623', 1624' are arranged in a 2×2 matrix. However, the present invention is not limited to this embodiment. For example, in another embodiment, the four second mating features can be arranged in a line, and the four second cooperating features can be arranged in a line.

As shown in FIG. 12, FIG. 13, FIG. 16 and FIG. 21, the third mating module 17' is disposed between the third module 13' and the fourth module 14'. The third mating module 17' includes a third mating structure 171' and a third cooperating structure 172'. The third mating structure 171' is formed on a left side of the fourth backplane assembly 141' of the fourth module 14'. The third mating structure 171' includes four third mating features 1711', 1712', 1713', 1714'. The two upper third mating features 1711', 1712' are a third protruding mating feature and a third flat mating feature, respectively. The two lower third mating features 1713', 1714' are a third recessed mating feature and a third flat mating feature, respectively. The third cooperating structure 172' is formed on a right side of the third backplane assembly 131' of the third module 13'. The third cooperating structure 172' includes four third cooperating features 1721', 1722', 1723', 1724'. The two upper third cooperating features 1721', 1722' are two third recessed cooperating features. The two lower third cooperating features 1723', 1724' are two third flat cooperating features. When the fourth backplane assembly 141' of the fourth module 14' is to be assembled with the right side of the third backplane assembly 131' of the third module 13', the upper third mating feature 1711' is configured to stretch into the upper third cooperating feature 1721' for allowing the fourth backplane assembly 141' of the fourth module 14' to be assembled with the right side of the third backplane assembly 131' of the third module 13' without any obstruction.

Preferably, in this embodiment, the four third mating features 1711', 1712', 1713', 1714' are arranged in a 2×2 matrix, and the four third cooperating features 1721', 1722', 1723', 1724' are arranged in a 2×2 matrix. However, the present invention is not limited to this embodiment. For example, in another embodiment, the four third mating features can be arranged in a line, and the four third cooperating features can be arranged in a line.

As shown in FIG. 12, FIG. 13, FIG. 17 and FIG. 22, the fourth mating module 18' is disposed between the fourth module 14' and the fifth module 10'. The fourth mating module 18' includes a fourth mating structure 181' and a fourth cooperating structure 182'. The fourth mating structure 181' is formed on a left side of the fifth backplane assembly 101' of the fifth module 10'. The fourth mating structure 181' includes four fourth mating features 1811', 1812', 1813', 1814'. The two upper fourth mating features 1811, 1812 are a fourth protruding mating feature and a fourth flat mating feature, respectively. The two lower fourth mating features 1813', 1814' are a fourth recessed mating feature and a fourth flat mating feature, respectively. The fourth cooperating structure 182' is formed on a right side of the fourth backplane assembly 141' of the fourth module 14'. The fourth cooperating structure 182' includes four fourth cooperating features 1821', 1822', 1823', 1824'. The two upper fourth cooperating features 1821', 1822' are a fourth recessed cooperating feature and a fourth flat cooperating feature, respectively. The two lower fourth cooperating features 1823', 1824' are a fourth protruding cooperating feature and a fourth recessed cooperating feature, respectively. When the fifth backplane assembly 101' of the fifth module 10' is to be assembled with the right side of the fourth backplane assembly 141' of the fourth module 14', the upper fourth mating feature 1811' is configured to stretch into the upper fourth cooperating feature 1821' for allowing the fifth backplane assembly 101' of the fifth module 10' to be assembled with the right side of the fourth backplane assembly 141' of the fourth module 14' without any obstruction.

Preferably, in this embodiment, the four fourth mating features 1811', 1812', 1813', 1814' are arranged in a 2×2 matrix, and the four fourth cooperating features 1821', 1822', 1823', 1824' are arranged in a 2×2 matrix. However, the present invention is not limited to this embodiment. For example, in another embodiment, the four third mating features can be arranged in a line, and the four third cooperating features can be arranged in a line.

It should be noticed that as shown in FIG. 14 and FIG. 21, when the fourth backplane assembly 141' of the fourth module 14' is to be assembled with the right side of the first backplane assembly 111' of the first module 11' by mistake, the upper third mating feature 1711' is configured to abut against the upper first cooperating feature 1521' for preventing the fourth backplane assembly 141' of the fourth module 14' from being assembled with the right side of the first backplane assembly 111' of the first module 11'. As shown in FIG. 14 and FIG. 22, when the fifth backplane assembly 101' of the fifth module 10' is to be assembled with the right side of the first backplane assembly 111' of the first module 11' by mistake, the upper fourth mating feature 1811' is configured to abut against the upper first cooperating feature 1521' for preventing the fifth backplane assembly 101' of the fifth module 10' from being assembled with the right side of the first backplane assembly 111' of the first module 11'. As shown in FIG. 15 and FIG. 21, when the fourth backplane assembly 141' of the fourth module 14' is to be assembled with the right side of the second backplane assembly 121' of the second module 12' by mistake, the upper third mating feature 1711' is configured to abut against the upper second cooperating feature 1621' for preventing the fourth backplane assembly 141' of the fourth module 14' from being assembled with the right side of the second backplane assembly 121' of the second module 12'. As shown in FIG. 15 and FIG. 22, when the fifth backplane assembly 101' of the fifth module 10' is to be assembled with the right side of the second backplane assembly 121' of the second module 12' by mistake, the upper fourth mating feature 1811' is configured to abut against the upper second cooperating feature 1621' for preventing the fifth backplane assembly 101' of the fifth module 10' from being assembled with the right side of the second backplane assembly 121' of the second module 12'.

In addition, as shown in FIG. 18, four fifth cooperating features 1921', 1922', 1923', 1924' are disposed on a right side of the fifth backplane assembly 101' of the fifth module 10' for allowing interchanged configuration of the fourth module 14' and the fifth module 10', i.e., allowing the fifth backplane assembly 101' of the fifth module 10' and the fourth backplane assembly 141' of the fourth module 14' to be respectively assembled with the right side of the third backplane assembly 131' of the third module 13' and the right side of the fifth backplane assembly 101' of the fifth module 10'. Specifically, the two upper fifth cooperating features 1921', 1922' are a fifth recessed cooperating feature and a fifth flat cooperating feature, respectively, and the two lower fifth cooperating features 1923', 1924' are a fifth protruding cooperating feature and a fifth recessed cooperating feature, respectively. As shown in FIG. 16 and FIG. 22, when the fifth backplane assembly 101' of the fifth module 10' is to be assembled with the right side of the third backplane assembly 131' of the third module 13', the upper fourth mating feature 1811' is configured to stretch into the upper third cooperating feature 1721' for allowing the fifth backplane assembly 101' of the fifth module 10' to be assembled with the right side of the third backplane assembly 131' of the third module 13' without any obstruction. As shown in FIG. 18 and FIG. 21, when the fourth backplane assembly 141' of the fourth module 14' is to be assembled with the right side of the fifth backplane assembly 101' of the fifth module 10', the upper third mating features 1711' is configured to stretch into the upper fifth cooperating feature 1921', and the lower fifth cooperating feature 1923' is configured to stretch into the lower third mating feature 1713', so as to allow the fourth backplane assembly 141' of the fourth module 14' to be assembled with the right side of the fifth backplane assembly 101' of the fifth module 10' without any obstruction.

Besides, as shown in FIG. 16 and FIG. 19, when the second backplane assembly 121' of the second module 12' is to be assembled with the right side of the third backplane assembly 131' of the third module 13' by mistake, the two lower first mating features 1513', 1514' are configured to respectively abut against the two lower third cooperating features 1723', 1724' for preventing the second backplane assembly 121' of the second module 12' from being assembled with the right side of the third backplane assembly 131' of the third module 13'. As shown in FIG. 17 and FIG. 19, when the second backplane assembly 121' of the second module 12' is to be assembled with the right side of the fourth backplane assembly 141' of the fourth module 14' by mistake, the lower first mating feature 1513' is configured to abut against the lower fourth cooperating feature 1823' for preventing the second backplane assembly 121' of the second module 12' from being assembled with the right side of the fourth backplane assembly 141' of the fourth module 14'. As shown in FIG. 18 and FIG. 19, when the second backplane assembly 121' of the second module 12' is to be assembled with the right side of the fifth backplane assembly 101' of the fifth module 10' by mistake, the lower first mating feature 1513' is configured to abut against the lower fifth cooperating feature 1923' for preventing the second backplane assembly 121' of the second module 12' from being assembled with the right side of the fifth backplane assembly 101' of the fifth module 10'.

Furthermore, as shown in FIG. 17 and FIG. 20, when the third backplane assembly 131' of the third module 13' is to be assembled with the right side of the fourth backplane assembly 141' of the fourth module 14' by mistake, the lower second mating feature 1613' is configured to abut against the lower fourth cooperating feature 1823' for preventing the third backplane assembly 131' of the third module 13' from being assembled with the right side of the fourth backplane assembly 141' of the fourth module 14'. As shown in FIG. 18 and FIG. 20, when the third backplane assembly 131' of the third module 13' is to be assembled with the right side of the fifth backplane assembly 101' of the fifth module 10' by mistake, the lower second mating feature 1613' is configured to abut against the lower fifth cooperating feature 1923' for preventing the third backplane assembly 131' of the third module 13' from being assembled with the right side of the fifth backplane assembly 101' of the fifth module 10'. As shown in FIG. 18 and FIG. 20, when the third backplane assembly 131' of the second module 13' is to be assembled with the right side of the fifth backplane assembly 101' of the fifth module 10' by mistake, the lower second mating feature 1613' is configured to abut against the lower fifth cooperating feature 1923' for preventing the third backplane assembly 131' of the third module 13' from being assembled with the right side of the fifth backplane assembly 101' of the fifth module 10'.

Understandably, the mating feature and the cooperating feature of the present invention are not limited to the aforementioned embodiments. For example, each mating module can include two or more mating features and two or more cooperating features, and each mating feature or each cooperating feature can be configured to be a flat feature, a protruding feature or a recessed feature according to a relation provided in the following Table 1, wherein "0" represents two corresponding modules are allowed to be assembled with each other, and "X" represents two corresponding module are not allowed to be assembled with each other. In order to allow assembly of two modules, when a mating feature is a protruding mating feature, a corresponding cooperating feature is a recessed cooperating feature; when a mating feature is a flat mating feature, a corresponding cooperating feature is a flat cooperating feature or a recessed cooperating feature; when a mating feature is a recessed mating feature, a corresponding cooperating feature is a protruding cooperating feature, a flat cooperating feature or a recessed cooperating feature. In order to restrain assembly of two modules, when a mating feature is a protruding mating feature, a corresponding cooperating feature is a protruding cooperating feature or a flat cooperating feature; when a mating feature is a flat mating feature, a corresponding cooperating feature is a protruding cooperating feature. As shown in the following Table 1, a power supply module is configured to be restrained from being assembled with a right side of one of another power supply module, a signal switch module, a computing module and a signal input/output module. A signal switch module is configured to be allowed to be assembled with a right side of a power supply module, and restrained from being assembled with a right side of one of another signal switch module, a computing module and a signal input/output module. A computing module is configured to be allowed to be assembled with a right side of one of a power supply module and a signal switch module, and restrained from being assembled with a right side of one of another computing module and a signal input/output module. A signal input/output module is configured to be allowed to be assembled with a right side of one of a computing module and another signal input/output module, and restrained from being assembled with a right side of one of a power supply module and a signal switch module.

TABLE 1

| | Right module (front view) | | | |
|---|---|---|---|---|
| Left module (front view) | Power supply module | Signal switch module | Computing module | Signal input/output module |
| Power supply module | X | ○ | ○ | X |
| Signal switch module | X | X | ○ | X |
| Computing module | X | X | X | ○ |
| Signal input/output module | X | X | X | ○ |

Furthermore, understandably, a corresponding backplane assembly, a corresponding mating structure and a corresponding structure can be integrated together as a unit. For example, the second backplane assembly, the first mating structure and the second cooperating structure can be integrated together, so as to be considered as a rail mounting backplane kit. Furthermore, the first backplane assembly and the first cooperating structure can be integrated together, so as to be considered as a first cooperating backplane kit with respect to the rail mounting backplane kit, and the third backplane assembly, the second mating structure and the third cooperating structure can be integrated together, so as to be considered as a second cooperating backplane kit with respect to the rail mounting backplane kit.

In contrast to the prior art, the present invention can ensure the first cooperating backplane assembly, the backplane assembly and the second cooperating backplane assembly to be assembled together in a proper sequence, or ensure the first backplane assembly, the second backplane assembly, the third backplane assembly and the fourth backplane assembly to be assembled together in a proper sequence. Therefore, the present invention can effectively prevent damage or functional failure caused by an error of assembly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rail mounting backplane kit comprising:

a backplane assembly;

a first mating structure formed on the backplane assembly, the first mating structure comprising a plurality of first mating features, each of the plurality of first mating features being a first protruding mating feature, a first flat mating feature or a first recessed mating feature, the first mating structure being configured to cooperate with a first cooperating structure of a first cooperating backplane kit for allowing and preventing an assembly of the backplane assembly and a first cooperating backplane assembly of the first cooperating backplane kit; and a second cooperating structure formed on the backplane assembly, the second cooperating structure comprising a plurality of second cooperating features, each of the plurality of second cooperating features being a second protruding cooperating feature, a second flat cooperating feature or a second recessed cooperating feature, the second cooperating structure being configured to cooperate with a second mating structure of a second cooperating backplane kit for allowing or preventing an assembly of the backplane assembly and a second cooperating backplane assembly of the second cooperating backplane kit;

wherein when one of the plurality of first mating features and a corresponding one of a plurality of first cooperating features of the first cooperating structure are the first protruding mating feature and one of a first protruding cooperating feature and a first flat cooperating feature, respectively, the first protruding mating feature is configured to abut against the first protruding cooperating feature or the first flat cooperating feature for preventing the assembly of the backplane assembly of the rail mounting backplane kit and the first cooperating backplane assembly of the first cooperating backplane kit.

2. The rail mounting backplane kit of claim 1, wherein the plurality of first mating features are arranged in a matrix, and the plurality of second cooperating features are arranged in a matrix.

3. The rail mounting backplane kit of claim 1, wherein when one of the plurality of first mating features and a corresponding one of a plurality of first cooperating features of the first cooperating structure are the first protruding mating feature and a first recessed cooperating feature, respectively, the first protruding mating feature is configured to stretch into the first recessed cooperating feature for allowing the assembly of the backplane assembly of the rail mounting backplane kit and the first cooperating backplane assembly of the first cooperating backplane kit.

4. The rail mounting backplane kit of claim 1, wherein when one of the plurality of second cooperating features and a corresponding one of a plurality of second mating features of the second mating structure are the second protruding cooperating feature and a second recessed mating feature, respectively, the second protruding cooperating feature is configured to stretch into the second recessed mating feature for allowing the assembly of the backplane assembly of the rail mounting backplane kit and the second cooperating backplane assembly of the second cooperating backplane kit.

5. The rail mounting backplane kit of claim 1, wherein when one of the plurality of second cooperating features and a corresponding one of a plurality of second mating features of the second mating structure are the second protruding cooperating feature and one of a second protruding mating feature and a second flat mating feature, respectively, the second protruding cooperating feature is configured to abut against the second protruding mating feature or the second flat mating feature for preventing the assembly of the backplane assembly of the rail mounting backplane kit and the second cooperating backplane assembly of the second cooperating backplane kit.

6. A rail mounting electronic device comprising:

a first module;

a second module detachably assembled with the first module;

a first mating module disposed between the first module and the second module, the first mating module comprising:

a first mating structure formed on the second module, the first mating structure comprising a plurality of first mating features, each of the plurality of first mating features being a first protruding mating feature, a first flat mating feature or a first recessed mating feature; and a first cooperating structure formed on the first module, the first cooperating structure comprising a plurality of first cooperating features, each of the plurality of first cooperating features being a first protruding cooperating feature, a first flat cooperating feature or a first recessed cooperating feature;

a third module detachably assembled with the second module; and a second mating module disposed between the second module and the third module, the second mating module comprising:

a second mating structure formed on the third module, the second mating structure comprising a plurality of second mating features, each of the plurality of second mating features being a second protruding mating feature, a second flat mating feature or a second recessed mating feature; and a second cooperating structure formed on the second module, the second cooperating structure comprising a plurality of second cooperating features, each of the plurality of second cooperating features being a second protruding cooperating feature, a second flat cooperating feature or a second recessed cooperating feature;

wherein when one of the plurality of first mating features is the first protruding mating feature, a corresponding one of the plurality of first cooperating features is the first recessed cooperating feature;

wherein when one of the plurality of first mating features is the first flat mating feature, a corresponding one of the plurality of first cooperating features is the first flat cooperating feature or the first recessed cooperating feature;

wherein when one of the plurality of first mating features is the first recessed mating feature, a corresponding one of the plurality of first cooperating features is the first protruding cooperating feature, the first flat cooperating feature or the first recessed cooperating feature;

wherein when one of the plurality of second mating features is the second protruding mating feature, a corresponding one of the plurality of second cooperating features is the second recessed cooperating feature;

wherein when one of the plurality of second mating features is the second flat mating feature, a corresponding one of the plurality of second cooperating features is the second flat cooperating feature or the second recessed cooperating feature;

wherein when one of the plurality of second mating features is the second recessed mating feature, a corresponding one of the plurality of second cooperating features is the second protruding cooperating feature, the second flat cooperating feature or the second recessed cooperating feature;

wherein when one of the plurality of second mating features is the second protruding mating feature and a corresponding one of the plurality of first cooperating features is the first flat cooperating feature or the first protruding cooperating feature, the second protruding mating feature is configured to abut against the first flat cooperating feature or the first protruding cooperating feature for preventing an assembly of the first module and the third module.

7. The rail mounting electronic device of claim 6, wherein the plurality of first mating features are arranged in a matrix, and the plurality of first cooperating features are arranged in a matrix.

8. The rail mounting electronic device of claim 6, wherein the first module, the second module and the third module are a power supply module, a computing module and a signal input/output module, respectively.

9. The rail mounting electronic device of claim 6, wherein the plurality of first mating features are arranged in a matrix, the plurality of second mating features are arranged in a matrix, the plurality of first cooperating features are arranged in a matrix, and the plurality of second cooperating features are arranged in a matrix.

10. The rail mounting electronic device of claim 6, further comprising:

a fourth module detachably assembled with the third module; and a third mating module disposed between the third module and the fourth module, the third mating module comprising:

a third mating structure formed on the fourth module, the third mating structure comprising a plurality of third mating features, each of the plurality of third mating features being a third protruding mating feature, a third flat mating feature or a third recessed mating feature; and a third cooperating structure formed on the third module, the third cooperating structure comprising a plurality of third cooperating features, each of the plurality of third cooperating features being a third protruding cooperating feature, a third flat cooperating feature or a third recessed cooperating feature;

wherein when one of the plurality of third mating features is the third protruding mating feature, a corresponding one of the plurality of third cooperating features is the third recessed cooperating feature;

wherein when one of the plurality of third mating features is the third flat mating feature, a corresponding one of the plurality of third cooperating features is the third flat cooperating feature;

wherein when one of the plurality of third mating features is the third recessed mating feature, a corresponding one of the plurality of third cooperating features is the third protruding cooperating feature.

11. The rail mounting electronic device of claim 10, wherein when one of the plurality of second mating features is the second protruding mating feature, a corresponding one of the plurality of first cooperating features is the first flat cooperating feature or the first protruding cooperating feature.

12. The rail mounting electronic device of claim 11, wherein when one of the plurality of third mating features is the third protruding mating feature, a corresponding one of the plurality of first cooperating features is the first flat cooperating feature or the first protruding cooperating feature, and a corresponding one of the plurality of second cooperating features is the second recessed cooperating feature.

13. The rail mounting electronic device of claim 12, wherein the first module, the second module, the third module and the fourth module are a power supply module, a computing module, a signal input/output module and an additional signal input/output module, respectively.

14. The rail mounting electronic device of claim 10, wherein when one of the plurality of second mating features is the second protruding mating feature and a corresponding one of the plurality of first cooperating features is the first recessed cooperating feature, the second protruding mating feature is configured to stretch into the first recessed cooperating feature for allowing the assembly of the first module and the third module.

15. The rail mounting electronic device of claim 14, wherein when one of the plurality of third mating features is the third protruding mating feature, a corresponding one of the plurality of first cooperating feature is the first flat cooperating feature or the first protruding cooperating feature, and a corresponding one of the plurality of second cooperating feature is the second flat cooperating feature or the second protruding cooperating feature.

16. The rail mounting electronic device of claim 15, wherein the first module, the second module, the third module and the fourth module are a power supply module, a signal switch module, a computing module and a signal input/output module, respectively.

17. The rail mounting electronic device of claim 10, wherein the plurality of first mating features are arranged in a matrix, the plurality of second mating features are arranged in a matrix, the plurality of third mating features are arranged in a matrix, the plurality of first cooperating features are arranged in a matrix, the plurality of second cooperating features are arranged in a matrix, and the plurality of third cooperating features are arranged in a matrix.

* * * * *